United States Patent [19]

Sassa et al.

[11] Patent Number: 5,373,808
[45] Date of Patent: Dec. 20, 1994

[54] METHOD AND APPARATUS FOR PRODUCING COMPOUND SEMICONDUCTOR SINGLE CRYSTAL OF HIGH DECOMPOSITION PRESSURE

[75] Inventors: Koichi Sassa; Takashi Atami; Keiji Shirata, all of Saitama, Japan

[73] Assignees: Mitsubishi Materials Corporation; Research Development Corporation of Japan, both of Tokyo; Zaidan Hojin Handotai Kenkyu Shinkokai, Sendai, all of Japan

[21] Appl. No.: 50,325

[22] PCT Filed: Nov. 12, 1991

[86] PCT No.: PCT/JP91/01547
 § 371 Date: May 19, 1993
 § 102(e) Date: May 19, 1993

[87] PCT Pub. No.: WO93/22040
 PCT Pub. Date: Nov. 11, 1993

[30] Foreign Application Priority Data

Sep. 19, 1991 [JP] Japan ................. 3-239938
Sep. 20, 1991 [JP] Japan ................. 3-242043

[51] Int. Cl.$^5$ .................................... C30B 15/22
[52] U.S. Cl. ........................... 117/216; 117/13; 117/208
[58] Field of Search .......... 156/617.1, 618.1, 619.1, 156/620.2, DIG. 70; 422/248, 249

[56] References Cited

U.S. PATENT DOCUMENTS

| | | |
|---|---|---|
| 4,750,969 | 6/1988 | Sassa et al. |
| 4,761,202 | 8/1988 | Bordui et al. ................. 156/621 |
| 4,874,458 | 10/1989 | Nishizawa ................. 156/618.1 |
| 4,904,336 | 2/1990 | Ozawa et al. ................. 422/248 |
| 5,091,043 | 2/1992 | Shirata et al. ................. 156/DIG. 70 |

FOREIGN PATENT DOCUMENTS

| | | |
|---|---|---|
| 0210439 | 6/1986 | European Pat. Off. |
| 62-3096 | 1/1987 | Japan. |
| 1-153598 | 6/1989 | Japan. |
| 2-233578 | 9/1990 | Japan. |
| 2243588 | 9/1990 | Japan ................. 422/248 |

Primary Examiner—R. Bruce Breneman
Assistant Examiner—Felisa Garrett
Attorney, Agent, or Firm—Oblon, Spivak, McClelland, Maier & Neustadt

[57] ABSTRACT

An apparatus and a method are presented for preparing a single crystal ingot of a compound semiconductor material which contains a high vapor pressure component. The apparatus includes: a furnace housing 78 housing a cylindrical hermetic vessel 20 having a ceiling plate section 22A and a bottom plate section 42. External heaters 36, 38 and 40 surrounding the hermetic vessel 20, and a vapor pressure control section which communicates hermetically with the vessel 20. The vapor pressure control section includes: a vapor pressure control tube 98 having a hermetic inner space formed between an inner wall 102 and a coaxial outer wall 100; a communication conduit 96 which hermetically communicates the inner space of the vapor pressure control tube 98 with the inner space of the vessel 20; heat pipes 108, 112 extending along at least one of either the inner wall or the outer wall; control heaters 110, 114 disposed both on the inside of the inner wall and on the outside of the outer wall of the vapor pressure control section 98.

16 Claims, 15 Drawing Sheets

METHOD AND APPARATUS FOR PRODUCING COMPOUND SEMICONDUCTOR SINGLE CRYSTAL OF HIGH DECOMPOSITION PRESSURE

BACKGROUND OF THE INVENTION

1. Field of the Invention

The present invention relates to an apparatus and a method for processing dissociative compound semiconductors and their single crystals such as GaAS, containing a high vapor pressure component used for making laser elements and IC substrate materials.

2. Technical background

An example of an apparatus for processing a compound material having a high decomposition pressure is an apparatus shown in FIG. 15 which is disclosed in a Japanese Patent 1,490,669. This apparatus is used to produce a single crystal of a compound semiconductor material, such as GAS containing a high vapor pressure component, by a method known as the Czochralski method (CZ method).

In FIG. 15, the reference numeral 1 refers to a hermetic vessel for pulling a single crystal from a melt. The vessel 1 consists of an upper vessel section 2 and a lower vessel section 3 with a sealing material 5 between the upper and lower vessel sections. A push up rod 6 of the lower section 3 is provided with a stress-moderating device 7 so as to keep the stress imposed on the joint section 4 at a suitable value.

In the interior of the vessel 1 is a crucible 9 supported by a susceptor 8, which is rotated by the bottom rod 10. The vessel 1, which houses all of the above components, is heated by heaters 11a, 11b. A vapor pressure control section 12 is provided on the ceiling section of the upper vessel section 2. The interior wall temperature of the vapor pressure control section 12 is kept at a lower suitable temperature compared with the interior wall temperatures of the vessel 1. The vapor pressure within the vessel 1 is kept at a suitable constant pressure by condensing and adjusting the vapor pressure of the high vapor pressure component, thereby keeping the vapor pressure constant within the vessel 1 and maintaining the stoichiometry of the melt 13 in the crucible 9.

A view rod 14 for observing the growing section of a single crystal 18 is provided through the ceiling section of the vessel 1. The pulling rod 15 and the bottom rod 10 pass through a rotating seal 16 containing a liquid sealant such as $B_2O_3$. The entire configuration presented above is housed in an external housing 17.

Next, the method of producing a GAS single crystal using the apparatus described above will be explained. In this case, the high vapor pressure component is As and the other component is Ga.

First, a charge of Ga is placed in the crucible 9, and As feed is placed on the bottom plate section 1a of the vessel 1. After evacuating the entire apparatus, the bottom rod is pushed up to seal the vessel 1.

Next, the interior wall of the vessel 1, excepting the bottom plate section 1a, is heated by the heater 11a, followed by heating the bottom plate section 1a by the heater 11b, thereby heating the feed of As and subliming the As. Simultaneously, the Ga in the crucible 9 in the vessel 1 is heated to absorb the As vapor and react with the As, thereby synthesizing GAS in the crucible 9.

In this instance, the temperature distribution in the vessel 1 is controlled so that the bottom plate section 1a and the interior wall section of the vapor pressure control section 12 are at lower temperatures compared with those of regions in the vessel 1 so as to prevent As from condensing on the other regions. At the same time, an inert gas is introduced into the external housing 17 to obtain a pressure balance between the interior and exterior atmospheres of the vessel 1.

After completing the synthesizing step of the GAS melt 13 in the crucible 9, a single crystal seed A fixed to the bottom end of the pulling rod 15 is first immersed in the GAS melt, and then the seed A is rotated and pulled up by the pulling rod 15 while the temperature of the heaters 11a and 11b are lowered to grow a single crystal 18 as illustrated in FIG. 15.

The amount of As feed placed on the bottom plate section 1a of the vessel 1 is a sum of: the amount required to synthesize the GAS melt; the amount to fill the interior space of the vessel 1 as a gas at a certain constant pressure after the completion of the GAS melt synthesis; the amount condensed in the vapor pressure control section during the synthesizing and the crystal growing stages; and the amount lost from the vessel 1 during the various stages of production of the single crystal. The vapor pressure control section 12 has a volume capacity sufficient to hold the enough amount of As required to retain solid As until the completion of the production process even after supplementing the amount lost from the vessel 1.

However in the apparatus described above, it is difficult to control the sublimation rate of the As feed during the synthesis stage during which the melt temperature rises rapidly, and the sublimation rate of As becomes higher than the absorption rate of As vapor into the Ga liquid. This causes the As vapor pressure to rise in the vessel 1, and if a pressure balance between the interior and exterior atmospheres of the vessel could not be restored in time to compensate for such a rapid rise in the vapor pressure in the interior of the vessel 1, the sealing between the vessel sections may be destroyed, causing a large amount of As vapor to escape from the vessel 1. Therefore in the above apparatus, it was necessary to strictly control the temperatures of every region of the vessel 1, thus presenting difficulties in automating the process.

This problem was studied extensively by the present inventors, who discovered that in the above apparatus, the problem arose from the difficulty to thermally insulate the As feed material, placed on the bottom plate section 1a, from the parts held at high temperature like the crucible 9, and as the temperature of the crucible 9 rose, so did the temperature of the As feed material.

To lessen the degree of this problem, it is effective to lengthen the vertical dimension of the vessel 1 so as to distance the bottom plate section 1a away from the crucible 9. This approach is unsuitable however, because the vessel has a high thermal conductivity, and to achieve sufficient effect of such thermal isolation, it was necessary to lengthen the vessel 1 considerably, which made the operation of the apparatus inefficient.

The problem described above is not limited to the apparatus for growing single crystal such as that shown in FIG. 15. The same problem arises in compound synthesizing apparatuses and processing apparatuses designed to handle high vapor pressure materials.

The present invention was made in view of the technological problem present in the conventional apparatus as described above, and an objective is to present an apparatus and a method for accurately and reliably performing synthesis of compound materials having high vapor pressure, without sacrificing the operational facility of the apparatus.

SUMMARY OF THE INVENTION

The present invention relates to an apparatus and a method for producing a single crystal of a compound semiconductor material composed of a high vapor pressure component and a low vapor pressure component. An apparatus of the first embodiment of the present invention comprises: a furnace housing; an openable hermetic vessel of a cylindrical shape disposed inside the furnace housing and having a ceiling plate and a bottom plate section which seal the vessel hermetically; a bottom rod hermetically and rotatably inserted through the bottom plate section into the vessel; a crucible fixedly disposed on the top end of the bottom rod in the interior space of the vessel; a crystal pulling rod hermetically and rotatably inserted through the ceiling plate. A feed holder, which holds a feed charge of the high vapor pressure component material, is disposed in the interior space of the vessel. There is a hermetic vapor pressure control section, disposed in either the upper region or the lower region of the vessel, coaxially with either the crystal pulling rod or the bottom rod, and communicating hermetically with the vessel with a communication conduit. There are independently controlled heater means disposed on the external periphery of the vessel, at least around the upper region of the vessel, around the crucible region and around the feed holder region.

According to a first method of growing a single crystal of a compound semiconductor material, the apparatus is provided with a feed holder in the interior space of the hermetic vessel and a vapor pressure control section which communicates hermetically with the interior space of the vessel through a communication conduit. First a charge of the high vapor pressure component material is placed in the feed holder disposed in the interior space; and a charge of the low vapor pressure component material is placed in the crucible. Next, all the regions of the vessel excluding the feed holder and the vapor pressure control section are heated to a specific temperature, so as to heat and sublime the high pressure component material and transfer and condense the high vapor pressure component material into the vapor pressure control section. Next the charge of the low vapor pressure component material is heated in the crucible to a temperature higher than the melting point of the compound semiconductor material at the same time as the condensing step or after the completion of the condensing step; then the high vapor pressure component material condensed in the vapor pressure control section is heated to a specific temperature to produce vapor of the high vapor pressure component material thereby reacting the vapor of the high vapor pressure component material with the charge of low vapor pressure component material and synthesizing a melt of the compound semiconductor material in the crucible; and pulling a single crystal ingot from the melt of the compound semiconductor material while controlling the temperature of the vapor pressure control tube (VPCT).

According to the apparatus and the method presented above, because the vapor pressure control section can be readily thermally isolated from the hermetic vessel and controlled independently from each other, the feed material which has been transferred into the vapor pressure control section is not readily subject to thermal effects from the heat of the vessel, thereby enabling an accurate and easy control of the amount of the feed material to be supplied from the vapor pressure control section to the vessel. It follows therefore, that the synthesizing operation of a compound semiconductor material can be performed with accuracy. The method thus avoids the generation of a problem of accidental rapid build-up of vapor pressure inside the hermetic vessel due to the rapid sublimation of the high vapor pressure component material which leads to a loss of the high vapor pressure component. The synthesizing operation can therefore be automated easily.

Further, because the vapor pressure control section is not only separated from the hermetic vessel but surrounds either the top or the bottom rod, the internal volume of the vapor pressure control section can be made large without enlarging the entire apparatus.

A second embodiment is related to an apparatus for processing a compound semiconductor material having a high vapor pressure component. The apparatus comprises: a furnace housing; an openable cylindrical vessel disposed inside the furnace housing and having a ceiling plate and a bottom plate section which hermetically seal the vessel; heater means for heating the hermetic vessel; and a hermetic vapor pressure control section hermetically communicating with the vessel through a communication conduit. The vapor pressure control section is disposed below the hermetic vessel, and comprises a vapor pressure control container provided with an inner wall section and a coaxial outer wall section forming a hermetic space therein; a communication conduit passing through the bottom plate section of the vessel, and communicating the interior spaces of the vapor pressure control container and the hermetic vessel; heat pipes disposed along at least the inside surface of the inner wall section or the outside surface of the outer wall section of the vapor pressure control container; and control heaters disposed on both the inside of the inner control heater and the outside of the outer control heater.

According to the processing apparatus of the second embodiment, because of the cylindrical shape of the vapor pressure control container, a large surface area can be secured by increasing the diameter of the vapor pressure control section, thereby obtaining a sufficient volumetric capacity while keeping a relatively small radial dimension, thereby increasing the condensing rate of excess high vapor pressure material.

Further, the radial temperature distribution can be made uniform because of the small radial dimension of the vapor pressure control container. Further, the temperature distribution of the interior wall surface S of the vapor pressure control container can be made uniform because of the provision of control heaters on both the inside of the inner wall section and the outside of the outer wall section, thus enabling temperature control to be made from both the interior and exterior surfaces of the container, as well as because of the presence of heat pipes along at least one of the inner and outer wall sections.

Further, even when the vapor pressure control container is disposed below the vessel, adverse effects of the temperature variation on the bottom rod can be minimized by disposing control heaters between the bottom rod and the inner wall section of the vapor pressure control container, and adjusting the temperature of the control heaters to compensate for the temperature variation. The processing apparatus thus enables precision control of the interior temperature of the vapor pressure control container, thereby providing an accurate and reliable control over the vapor pressure of the high vapor pressure component.

A third embodiment of the processing apparatus of the present invention comprises: a furnace housing; an openable cylindrical vessel disposed in the furnace housing and having a ceiling plate and a bottom plate section which hermetically seal the vessel; heater means for heating the hermetic vessel; a hermetic vapor pressure control section, hermetically communicating with the interior space of the vessel through a communication conduit; and control heaters for heating the vapor pressure control section. A hermetic feed storing section is provided above and/or below the vessel, hermetically communicating with the interior space of the vessel. A control heater is provided to control the temperature of the feed storing section.

According to the second method of making a single crystal of a compound semiconductor material containing a high vapor pressure component, the method utilizes an apparatus comprising a feed holder disposed in the interior space of the vessel, a feed storing section communicating hermetically with the vessel, and a vapor pressure control section communicating hermetically with the vessel. The process steps are: disposing a charge of the high vapor pressure component material in the feed holder; disposing a charge of the low vapor pressure component material in a crucible inside the vessel; raising the temperature of all the regions of the vessel to a specific temperature excluding the feed holder, the feed storing section, and the vapor pressure control section; and raising the temperature of the feed holder to sublime the high vapor pressure component material. This is followed by transferring and condensing the vapor of the high pressure component material into both the vapor pressure control section and the feed storing section; heating the charge of the low vapor pressure component material in the crucible to a temperature higher than the melting point of the compound semiconductor material simultaneously with the condensing step or after the completion of the condensing step; heating the feed storing section to a specific temperature to sublime all the high vapor pressure component material condensed therein; making the vapor of the high pressure component material with the charge of low vapor pressure component material and synthesizing a melt of the compound semiconductor material. This is followed by pulling a single crystal ingot from the melt of the compound semiconductor material while holding the vapor pressure of the high vapor pressure component material constant by controlling the temperature of the vapor pressure control section.

The third embodiment of the processing apparatus and the second method of making a single crystal of a compound semiconductor material containing a high vapor pressure component provides a remarkable effect to moderate the rapid rise in the vapor pressure, for example, during synthesizing the compound melt. According to this embodiment, the feed storing section is held first at a relatively low temperature to condense the vapor, and the vapor is released under controlled conditions later during the synthesis. On the other hand, when it is required to control the vapor pressure precisely, for example, when pulling the crystal from the melt, the temperature of the feed storing section is first raised to a temperature to release all the feed material condensed therein, then the temperature of the vapor pressure control section is controlled at a specific constant temperature thereby keeping the vapor pressure at a constant value. In this embodiment, because the functions of vapor pressure moderation and vapor pressure control are separated, the size of the vapor pressure control section needs only to be sufficient to store the sufficient amount of feed to control the vapor pressure during the entire duration of the pulling process. Such a configuration facilitates realizing the uniform temperature distribution in the vapor pressure control section, and facilitates temperature control of the VPCS, thus facilitates the high precision vapor pressure control throughout the whole pulling process to assure the production of high quality single crystal ingots.

PREFERRED EMBODIMENTS OF THE INVENTION

The preferred embodiments of the present invention will be explained with reference to the drawings. In the following presentation, the embodiments are described in terms of GAS as an example of a compound semiconductor material having a high decomposition pressure (referred to as vapor pressure hereinbelow), but it should be noted that the present invention is equally applicable to other compound semiconductors such as InAs, InP, GaP.

First Embodiment

Figure 1:
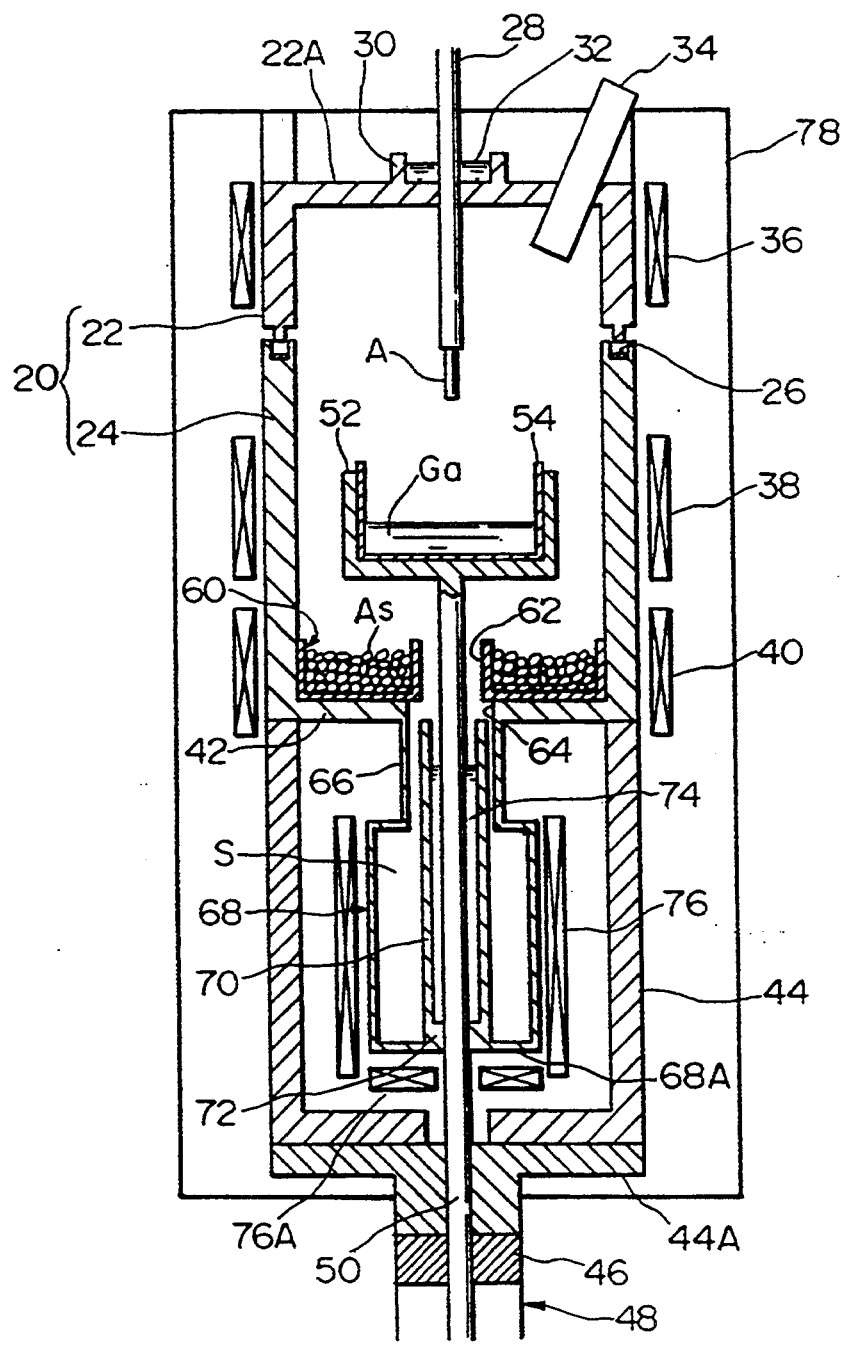
FIG. 1 is a cross sectional view of an apparatus of a first embodiment, showing the condition prior to the compound synthesis stage, for growing a single crystal of a dissociative compound semiconductor.
Figure 2:
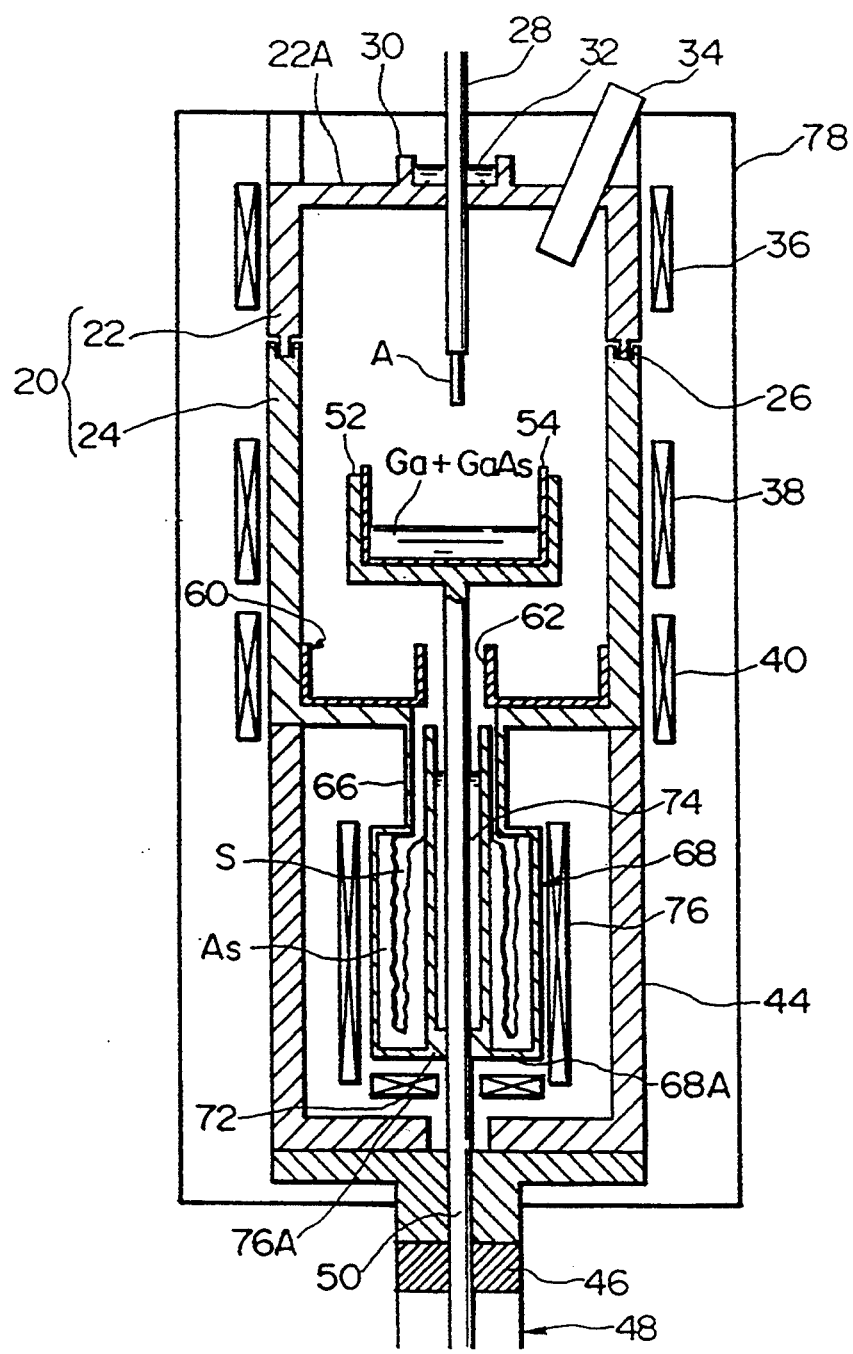
FIG. 2 is a cross sectional view of the apparatus of the first embodiment performing compound synthesis in the first embodiment.
Figure 3:
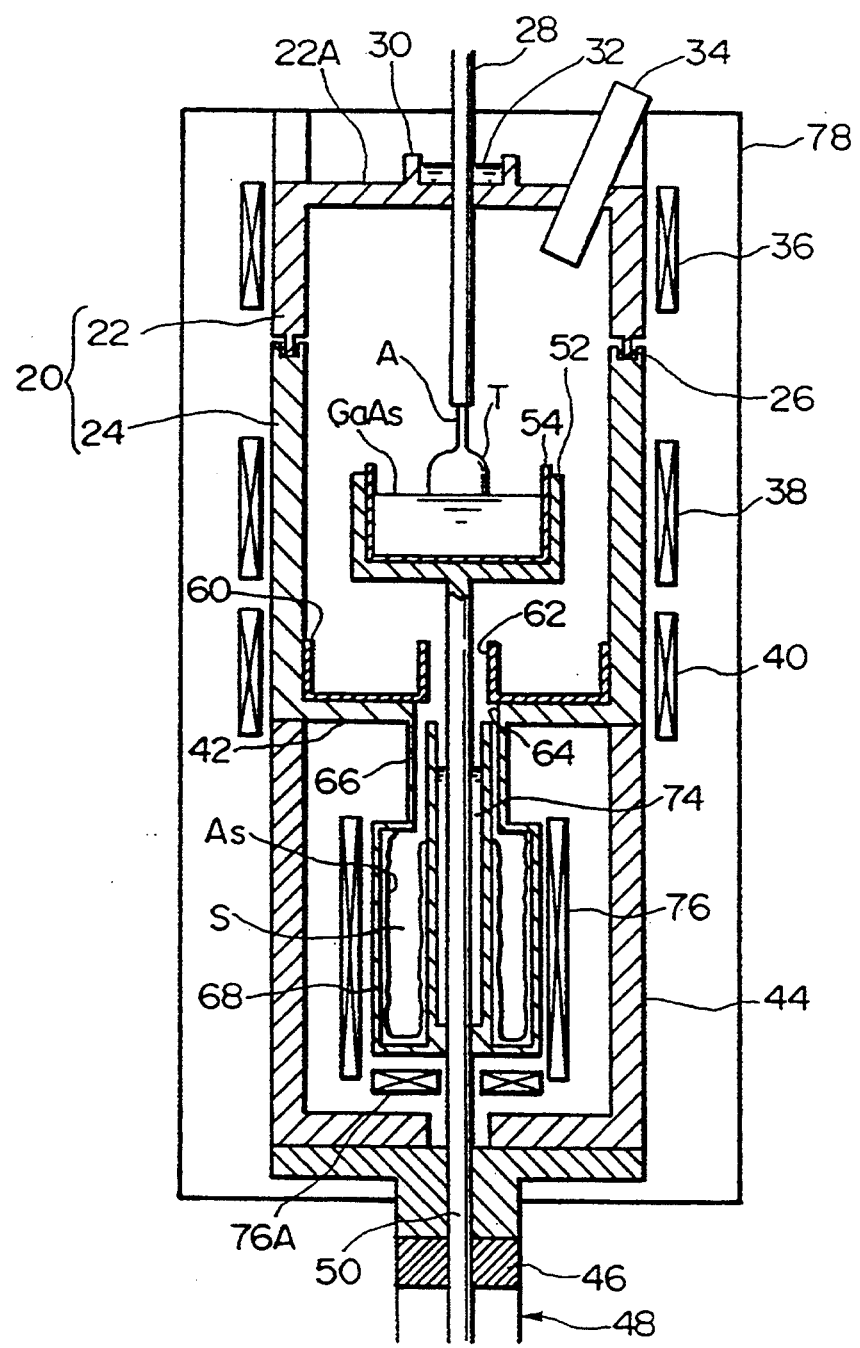
FIG. 3 is a cross sectional view of the apparatus of the first embodiment performing single crystal pulling in the first embodiment.

FIG. 1 shows a cross sectional view of an apparatus of a first embodiment. The reference numeral 20 refers to a cylindrical shaped hermetic vessel (shortened to vessel) which can contain gas therein. This vessel 20 is constructed so that it may be separated into an upper vessel section 22 and a lower vessel section 24. The two sections are hermetically sealed with a sealing material 26. A crystal pulling rod 28 passes through the center of the ceiling plate section 22A of the upper vessel section 22. On the external surface of the ceiling plate section 22A is provided a ring-shaped wall section 30 surrounding the pulling rod 28. The ring-shaped section 30 is filled with a liquid seal 32. There is also a viewing tube 34 which passes through the ceiling plate section 22A for observing the crystal growing region of the apparatus.

On the external periphery of the upper vessel section 22, there is provided a coaxial upper section heater 36 (heating means), and on the lower vessel section 24 is provided with a coaxial middle section heater 38 (heating means) to encircle the location of the crucible 54. There is a coaxial lower section heater 40 (heating means) to encircle the bottom region of the lower vessel section 24.

The bottom end of the lower vessel section 24 is closed with a bottom plate section 42 having a sealing material (not shown) there between. The bottom plate section 42 is fixed to a coaxial vessel support base 44 having a bottom, which is provided with a flange section 44A which is fixed to a bottom shaft 48 via a stress relaxing device 46. A bottom rod 50 is provided in the interior of the bottom shaft 48 so that the bottom rod 50 can be rotated as well as translated in the axial direction. The top section of the bottom rod 50 passes into the interior of the vessel 20 through the bottom plate section 42. The top end of the bottom rod 50 is fixed to the crucible 54 by way of a susceptor 52.

A ring-shaped feed dish (feed material dish) 60 is disposed coaxially with the bottom rod 50 on top of the bottom plate section 42 of the lower vessel section 24. The feed dish 60 is used to hold the high vapor pressure component of the compound semiconductor material (in this embodiment, As), and the inner diameter of its central hole 62 is larger than the outer diameter of the bottom rod 50, thereby forming a space between the bottom rod 50 and the center hole 64.

In the center of the bottom plate section 42 of the lower vessel section 24 is formed a center hole 64 having a larger inside diameter than the outer diameter of the bottom rod 50. The bottom plate section 42 is attached to a cylindrical communication conduit (communication conduit means) 66 extending towards the bottom of the furnace housing 78, and the bottom end of the communication conduit 66 is coaxially attached to a cylindrical vapor pressure control tube (shortened to VPCT) 68. Here, the construction material for the communication conduit 66 and the VPCT 68 is not restricted, but molybdenum, niobium or tungsten is suitable.

The interior of the VPCT 68 is constructed such that the bottom plate 68A thereof is fixed to a vertical support tube 70 which coaxially surrounds the bottom rod 50. The outer diameter of the support tube 70 is smaller than the inner diameter of the communication conduit 66, and the top end of the support tube 70 extends nearly to the bottom plate section 42 of the lower vessel section 24. The construction material of the support tube 70 may be the same as that of the communication conduit 66 and the VPCT 68. The interior space S formed between the inner surface of the VPCT 68 and the outer wall of the support tube 70 acts as a pressure modifier, and for it to perform its function well, it must have sufficient volume as well as sufficient surface area for allowing rapid condensation of the vapor. From these two viewpoints, it is preferable that its volume should be higher than 40% of a densely packed volume of the As contained in the feed dish 60.

A bearing section 72 is formed at a suitable location (at the bottom end in FIG. 1) of the support tube 70. The inner diameter of the bearing section 72 is about the same as the outer diameter of the bottom rod 50. The inner diameter of the support tube 70, excepting the bearing section 72, is made larger than the outer diameter of the bottom rod 50, and the inside space of the support tube 70 above the bearing section 72 is filled with a liquid sealant 74, such as $B_2O_3$. The bearing section 72 enables the bottom rod 50 to ascend or descend as well as rotate freely while the space between the support tube 70 and the shaft is hermetically sealed with the liquid sealant 74. The top end of the liquid sealant 74 is higher than that of the VPCT 68, and it reaches into the space within the communication conduit 66.

A cylindrical sidewall heater (control heater means) 76 is provided coaxially on the outer periphery of the VPCT 68. The purpose of the sidewall heater 76 is to prevent the bottom region of the VPCT 68 to be cooled due to radiative and conductive heat loss, and the axial length of the heater 76 is made longer than the axial dimension of the VPCT 68, and a ring-shaped bottom heater 76A is provided also below the bottom surface of the VPCT 68.

The hermetic vessel (shortened to vessel) 20, each of the heaters 36, 38, 40 and the container support base 44 are housed in a hermetic furnace housing 78. The furnace housing 78 is connected with a vacuum pump and an inert gas source (not shown).

A first embodiment using the apparatus shown in FIG. 1, for making a GaAs single crystal as an example of a dissociative compound semiconductor will now be presented.

First, the initial stage begins by opening the furnace housing 78 and the vessel 20, and placing a feed material As inside the feed dish 60 and Ga inside the crucible 54. Next, the furnace housing 78 is closed and evacuated. The vessel 20 is closed by raising the bottom shaft 48.

Next, the heaters 36 and 38 are turned on to heat the upper region of the vessel 20 to about 700°–1,000° C., then the heater 40 is turned on to heat and to sublime the As material in the feed dish 60 to 550°–700° C. At this time, because the temperature of the VPCT 68 is lower than other parts of the vessel 20, the sublimed As gradually condenses on the inner wall of the VPCT 68. The sublimation stage is continued until all the As is transferred from the feed dish 60 to the VPCT 68.

Next, the crucible 54 is heated with the heater 38 so as to raise the temperature of the Ga contained therein to a temperature above the melting point of GaAs, 1238° C., while the heaters 76, 76A are turned on so as to resublime As inside the VPCT 68 and supply As vapor to the interior of the vessel 20. The As vapor reacts with Ga in the crucible 54, and form a GaAs melt therein. During the sublimation/synthesis stages, the pressure inside the vessel 20 increases, therefore, inert gas is introduced inside the furnace housing 78 as necessary to maintain the pressure balance between the interior and exterior atmospheres of the vessel 20.

After the synthesis stage of GaAs is completed, the temperature of the VPCT 68 is kept at a constant temperature between 600°–620° C. By so doing, the As gas at the vapor pressure, corresponding to the constant temperature, fills the space within the vessel 20 while the excess As remains condensed in the VPCT 68, enabling to maintain an equilibrium vapor pressure of the GaAs melt in the crucible 54, thereby enabling to maintain the stoichiometry of the GaAs melt.

In the above step, because the surface temperature of the liquid sealant 74 is kept higher than the inner wall temperature of the VPCT 68, by the reflective and conductive heat from the upper part, there is no condensation of As on the liquid sealant 74. Therefore, there is no interference to the rotational freedom of the bottom rod 50 caused by the condensation of As vapor on the liquid sealant 74.

The above stage is followed by a crystal pulling stage in which the crystal pulling rod 28 is rotated and lowered to immerse the seed crystal into the melt while the bottom rod 50 is also rotated to grow a single crystal ingot T from the GaAs melt.

According to the apparatus and method for growing a single crystal presented above, the As contained in the feed dish 60 is first transferred into the vapor pressure control tube (VPCT) 68, and then the As vapor is supplied into the vessel 20 from the VPCT 68; therefore, even when the As sublimation occurs rapidly, a sudden rise in the As pressure is prevented by rapid absorption in the large capacity VPCT 68. It follows that there is no danger of excess As vapor pressure building up in the vessel 20 to cause the As vapor to spew out through the sealing material leading to a loss of the high pressure component material and a formation of an improper stoichiometric composition. The invented apparatus is also readily adaptable to automation.

Further, because the VPCT 68 is thermally isolated from the vessel 20 and its temperature is controlled independently by means of the heaters 76, 76A, the As contained in the VPCT 68 is not readily affected by the temperature of the vessel 20. Therefore, it becomes possible to readily and accurately control the supply of As vapor into the vessel 20 during the GaAs synthesis stage, thereby enabling to control the synthesis of GaAs.

Further, the VPCT 68 is disposed separately from the vessel 20 in the configuration surrounding the bottom rod 50, it is possible to provide a large internal volume for the VPCT 68 without enlarging the apparatus itself. For example, to densely pack a 8 Kg mass of solid As, it requires a container of 1.5L capacity. According to the shape of the VPCT 68 of the present invention, such a capacity can be furnished in a tube size of 100 mm outer diameter × 300 mm length.

As a variation in the method of synthesizing GaAs presented above, the following alternative is possible. After filling the feed dish 60 and the crucible 54 with As and Ga respectively, the furnace housing 78 is closed and evacuated, and the bottom shaft 48 is raised and the vessel 20 is sealed.

Next, while keeping the VPCT 68 at a temperature (550°–600° C.) which would not give too high vapor pressure of As, the temperature of the Ga in the crucible 54 is gradually raised to a temperature (above 1240° C.) for synthesizing the GaAs. The radiative heat sublimes the As in the feed dish 60 and intensive reaction occurs between the molten Ga and the sublimed As vapor. At this time, an inert gas is introduced into the furnace housing 78, and pressure is balanced between the interior and the exterior atmospheres of the vessel 20.

In this approach of synthesizing GaAs, there is a tendency for the subliming rate of As in the feed dish 60 to become high from the effect of radiation from the crucible 54. This effect can be controlled by regulating the temperature of the VPCT 68 properly as described above, thereby conducting synthesizing of GaAs and condensing of As vapor simultaneously without causing rapid increase in the excessive pressure of As vapor to be generated. This approach is advantageous than the previously described approach of condensing all the As once in the VPCT 68, because the operational process is shortened.

Experiment No. 1 based on the First Embodiment

GaAs single crystal growing trials were carried out using the apparatus shown in FIG. 1.

The vessel 20, the feed dish 60 and the vapor pressure control tube (VPCT) 68 were made by appropriately combining PBN (pyrolyic boron nitride) coated graphite and molybdenum. The sealing material 26 was a carbon gasket. The volumetric capacity of the feed dish was 2.5L, and that of the VPCT 68 was 1.1L. The crucible 54 was charged with a 5 Kg of Ga, and 5.6 Kg of As feed was placed in the feed dish 60. The furnace housing 78 was evacuated, and the bottom shaft 48 was raised to seal the vessel 20.

Next, the heaters 36, 38 were turned on to raise the temperature of the upper vessel section 22 to a temperature between 700°–1,000° C., and the heaters 76, 76A were turned on to raise the temperature of the VPCT 68 to about 500° C. (the As vapor pressure is 0.08 atm), after which the heater 40 is turned on to raise the temperature gradually to about 680° C. so as to sublime the As in the feed dish 60 completely. These temperatures are maintained until the interior pressure stabilizes in the vessel 20.

At this time, the temperature of the heater 38 is raised to gradually heat the Ga in the crucible 54 to about 1250° C., and the VPCT 68 is gradually raised to a temperature between 600°–680° C. by the heater 76 and 76A. Under these conditions, GaAs synthesis reaction was observed to occur. The reaction rate was possible to be adjusted finely by regulating the temperature of the VPCT 68. To balance the pressures between the interior and exterior atmospheres of the vessel 20, an inert gas was introduced into the furnace housing 78 to maintain about one atmospheric pressure. The time required for the synthesis of GaAs was about five hours.

After the synthesis stage was completed, while keeping the temperature of the heaters 76, 76A to maintain the VPCT 68 at 615° C., the temperature of the heater 38 was gradually lowered, and the seed crystal A attached to the crystal pulling rod 28 was immersed in the GaAs melt. The crystal pulling rod 28 was rotated and the seed crystal A was pulled up to grow a single crystal ingot T of 110 mm diameter and 160 mm length.

A comparatively small amount, 42 g of As, was lost during the above experiment, indicating that the pressure balance within the vessel 20 was not disturbed significantly during the GaAs synthesizing operation.

Electrical characteristics evaluation of the grown crystal by the Hall method showed the electrical resistivity of $1.4 \times 10^7$ $\Omega$*cm at the seed end, and the electron mobility of 6,700 cm$^2$/V.s at the seed end, and $1.3 \times 10^7$ $\Omega$*cm at the tail end, and 6,600 cm$^2$/V.s at the tail end, respectively.

These results demonstrates clearly that the stoichiometry control was carried out correctly during the synthesis of GaAs and the growth of the single crystal.

Experiment No. 2 based on the First Embodiment

The following experiment was conducted using the same apparatus and the feed material as those in Experiment No. 1.

In the GaAs synthesizing stage, while the temperature of the VPCT 68 was kept at 570°–600° C. (corresponding As vapor pressure is 0.4–0.9 atm) the temperature of Ga in the crucible 54 was gradually raised to 1250° C. The synthesizing reaction was observed to occur as the Ga temperature rose and the heat sublimed the As in the feed dish 60.

During this time, the inert gas was gradually introduced into the furnace housing 78 to attain one atmospheric pressure therein to maintain a vapor pressure balance inside and outside the vessel 20. After the As in the feed dish 60 was completely sublimated, the GaAs synthesis reaction was observed to occur as the temperature of the VPCT 68 was further raised to a temperature between 600°–680° C.

A single crystal ingot T was grown from the GaAs melt in the same way as in Experiment No. 1, and the ingot exhibited the similar size and electrical properties as described above.

The loss of As during the crystal growing process was 50 g, indicating that there was no significant loss of As vapor within the vessel 20.

Variation of the First Embodiment

Figure 4:
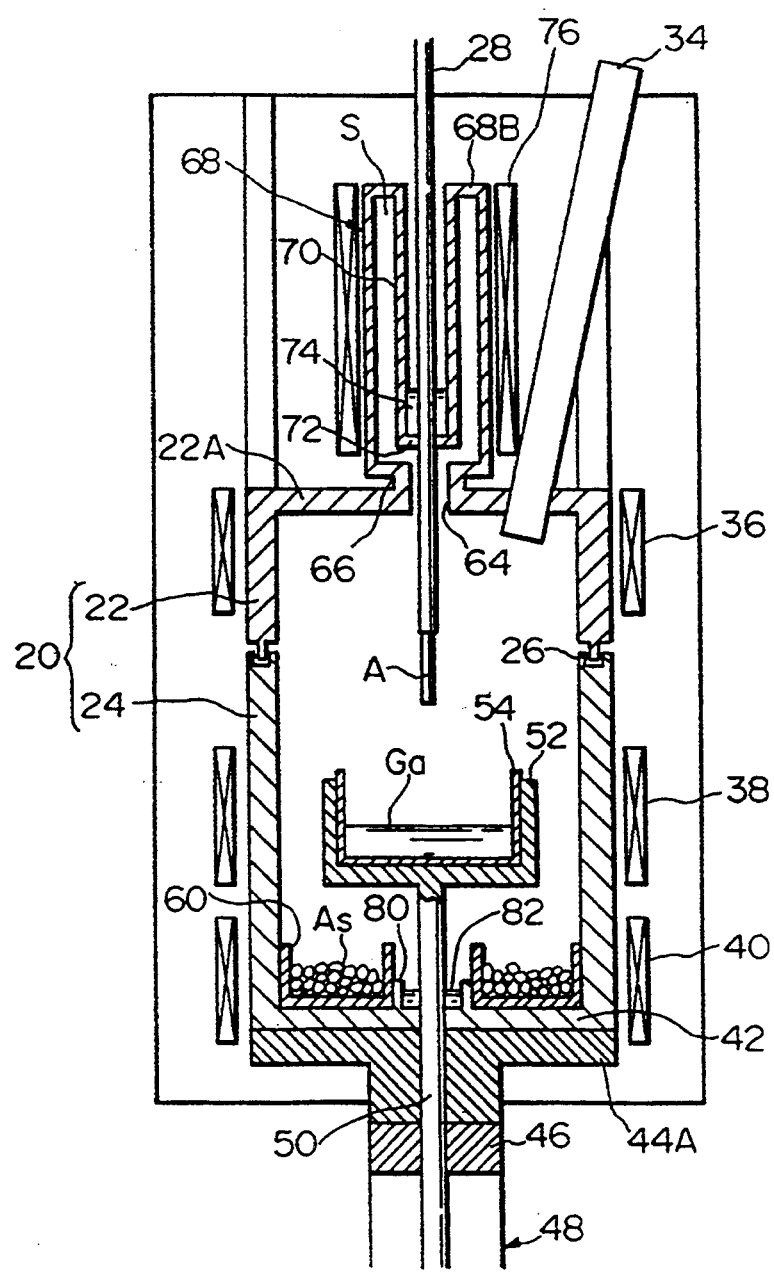
FIG. 4 is a cross sectional view of an apparatus of a variation of the first embodiment, showing the condition prior to the stage of compound synthesis, for growing a single crystal of a dissociative compound semiconductor.

A variation of the first embodiment of the apparatus of the present invention is shown in FIG. 4. The feature of the variation is that the VPCT 68 is disposed externally above the vessel 20. The reference numerals for the parts which are the same as those in the first embodiment are given the same reference numbers.

In the embodiment, a center hole 64 is provided on the ceiling plate section 22A of the upper vessel section 22, a communication conduit 66 is fixed straight vertically to the external surface of the ceiling plate section 22A at the center hole 64. A cylindrical VPCT 68 is fixed on the upper end of the communication conduit 66 so as to coaxially surround the crystal pulling rod 28 with the VPCT 68. A control heater 76 is disposed surrounding the VPCT 68. In the interior of the VPCT 68, there is a support tube 70 fixed vertically straight under the ceiling section 68B, and a bearing section 72 is formed on the lower end of the support tube 70. The upper end of the support tube 70 is opened, and a liquid sealant 74 is disposed above the bearing section 72 of the support tube 70. In the embodiment, the height of the liquid sealant 74 can be any suitable height. On the other hand, a ring-shaped wall section 80 is disposed in the inside of the feed dish 60 and on the upper surface of the bottom plate section 24 of the lower vessel section 24, and a liquid sealant 82 is disposed therein.

The apparatus of the embodiment can also be used the same way as in the first embodiment, and similar results was achieved.

Further, in the apparatus of the first embodiment and its variation, to obtain improved uniformity in the inner wall temperature distribution inside the VPCT, a heat pipe may be placed between the external surface of the VPCT 68 and the heater 76, or the heater 76 may be plural heaters disposed in the vertical axial direction, and regulated separately.

Second Embodiment

Figure 5:
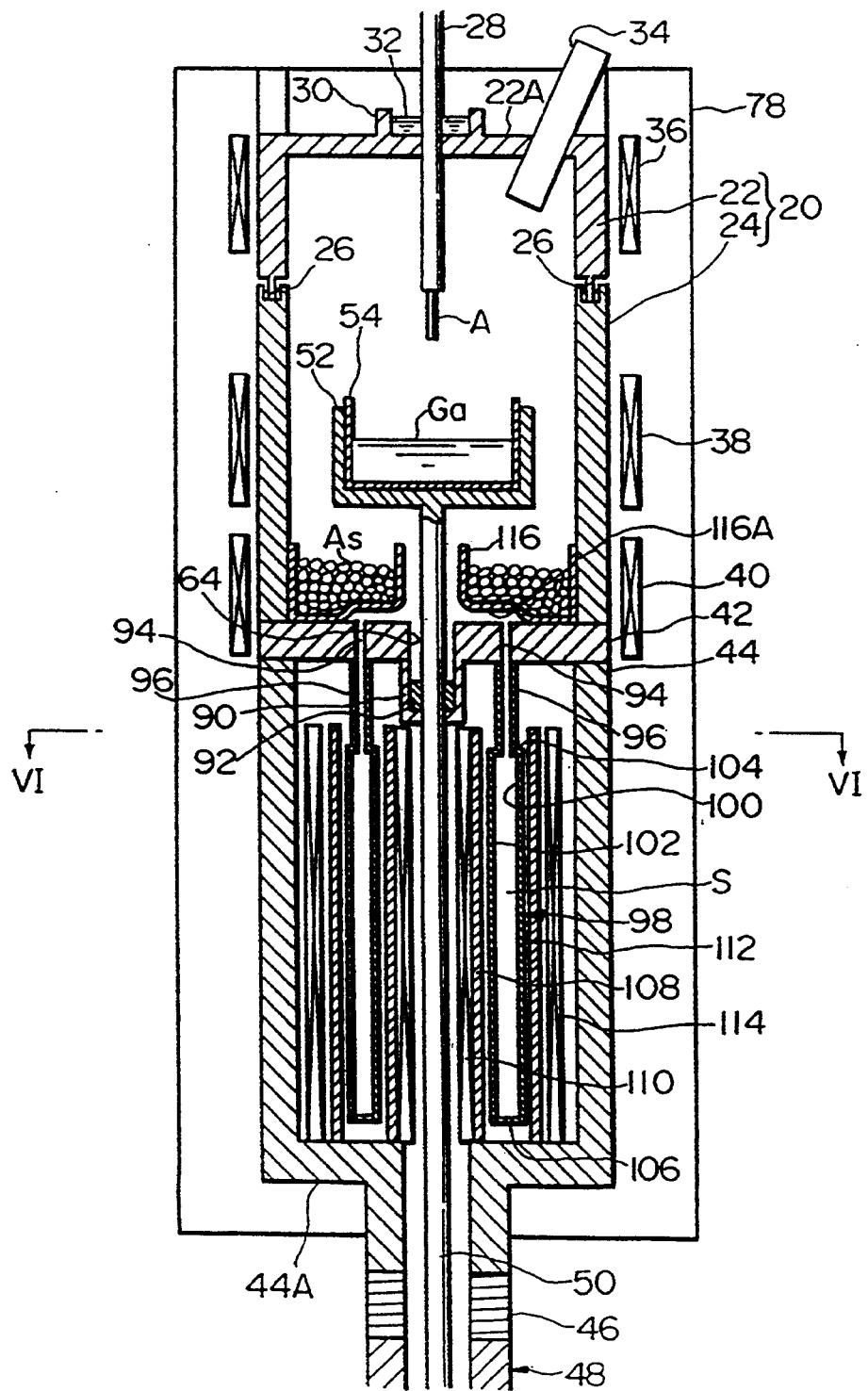
FIG. 5 is a cross sectional view of an apparatus of a second embodiment, showing the condition prior to the stage of compound synthesis, for growing a single crystal of a dissociative compound semiconductor.

FIG. 5 shows a cross sectional view of an apparatus of a second embodiment of the present invention, and the parts which are the same as those of the first embodiment are given the same reference numerals, and their explanations are omitted.

The bottom plate section 42 of the lower vessel section 24 is provided with a center hole 64 for passing the bottom rod 50 through, and from the periphery of the center hole 64 extends a cylindrical sealing material support section 90 downward. The space between the support section 90 and the bottom rod 50 is filled with a liquid sealant 92 such as Ba$_2$O$_3$. On the bottom plate section 42 are formed three through holes 94 surrounding the center hole 64 and separating from each other at 120 degrees, to which are fixed corresponding communication conduits 96 (communication means).

The bottom end of each of the communication conduits 96 is fixed to a vapor pressure control device (VPCD) 98. The VPCD 98 is provided with a cylindrical outer wall section 100 and an inner wall section 102, whose top and bottom ends are both closed, with a ring-shaped ceiling section 104 and a bottom section 106. The communication conduits 96 are fixed vertically to the ceiling plate section 104, and the interior space S of the VPCD 98 is communicated with the interior space of the vessel 20 by way of the communication conduits 96.

Figure 6:
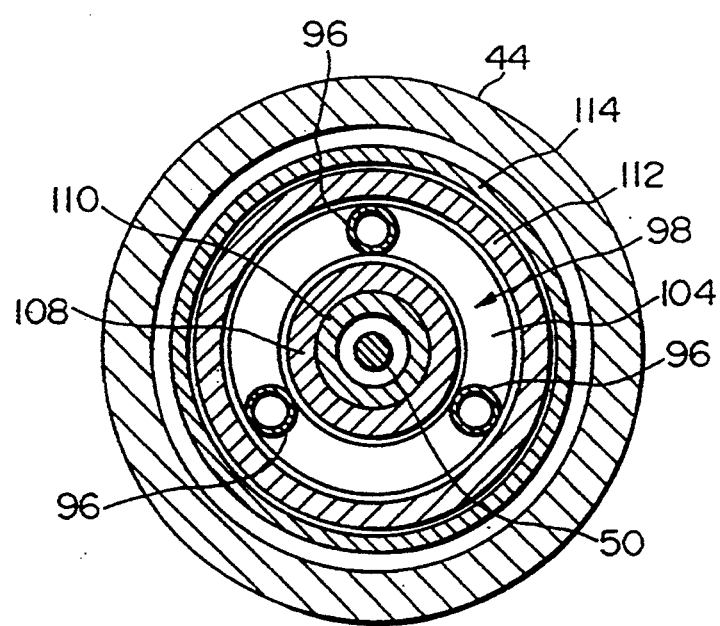
FIG. 6 is a cross sectional view of a section VI—VI shown in FIG. 5.

On the inside (the side close to the bottom rod 50) of the inner wall section 102 of the VPCD 98 is disposed a control heater (control heater means) 110 and a heat pipe 108 surrounding the control heater 110 coaxially with the bottom rod 50, as shown in FIG. 6. On the outside of the outer wall section 100 is disposed a cylindrical heat pipe 112 which is surrounded by a cylindrical control heater (control section heater means) 114, all coaxially with the bottom rod 50. The VPCD 98 and each of the heat pipes 108, 112 is either in a plane contact or spaced apart slightly.

The bottom ends of the heat pipes 108, 112 and the control heaters (heater means) 110, 114 are fixed to the lower flange section 44a of the container support base 44. The top ends of the heat pipes 108, 112 and the control heaters (heater means) 110, 114 extend beyond the top ends of the VPCD 98, and the bottom ends extend beyond the bottom ends of the VPCD 98 so as to produce a uniform distribution of temperature in the VPCD 98. For the same reasons as in the first embodiment, the interior volumetric capacity of the VPCD 98 is preferably such that over 40% of the As in the feed dish 116 (feed material holder) can be packed densely therein.

On the other hand, inside the vessel 20, a feed dish 116 is disposed above the bottom plate section 42. The feed dish 116 is ring-shaped, and its outer diameter is made slightly smaller than the inner diameter of the vessel 20, and its inner diameter is made considerably larger than the diameter of the bottom rod 50. In the central region of the bottom of the feed dish 116 is provided with a raised bottom section 116A so as not to cover over the openings of the through holes 94. Other structural features can be the same as those in the first embodiment.

The method of growing a crystal using the above apparatus will be explained.

As shown in FIG. 5, Ga is placed inside the crucible 54, and As feed is placed in the feed dish 116, and the entire apparatus is evacuated while raising the bottom shaft to press the sealing material 26.

Figure 7:
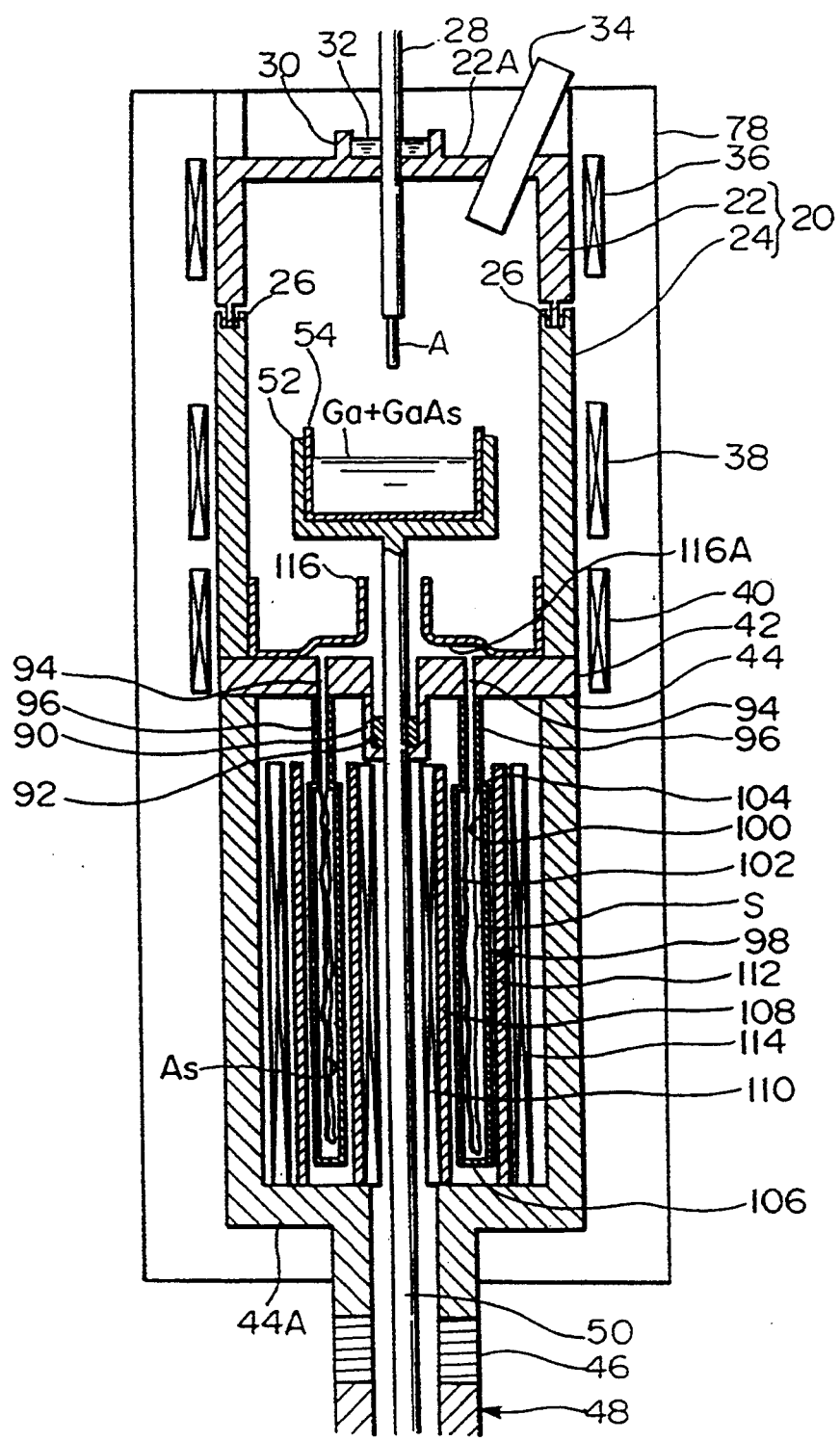
FIG. 7 is a cross sectional view of the apparatus performing compound synthesis in the second embodiment.

Next, the control heaters (heater means) 110, 114 is turned on to heat the VPCD 98 to a temperature between 500°–600° C., the upper 36, middle 38 and bottom 40 section heaters are turned on to heat the vessel 20 and sublime the As in the feed dish 116. The Ga in the crucible 54 reacts with the As vapor so synthesizes GaAs in the crucible while condensing the excess As vapor in the VPCD 98, as shown in FIG. 7. In the meantime, an inert gas is introduced into the furnace housing 78 to maintain pressure balance between the interior and exterior atmospheres of the vessel 20.

When the temperature of the GaAs melt in the crucible 54 has become sufficiently high, the temperature of the VPCD 98 is raised so as to continue GaAs synthesis while supplying As vapor from the VPCD 98.

Figure 8:
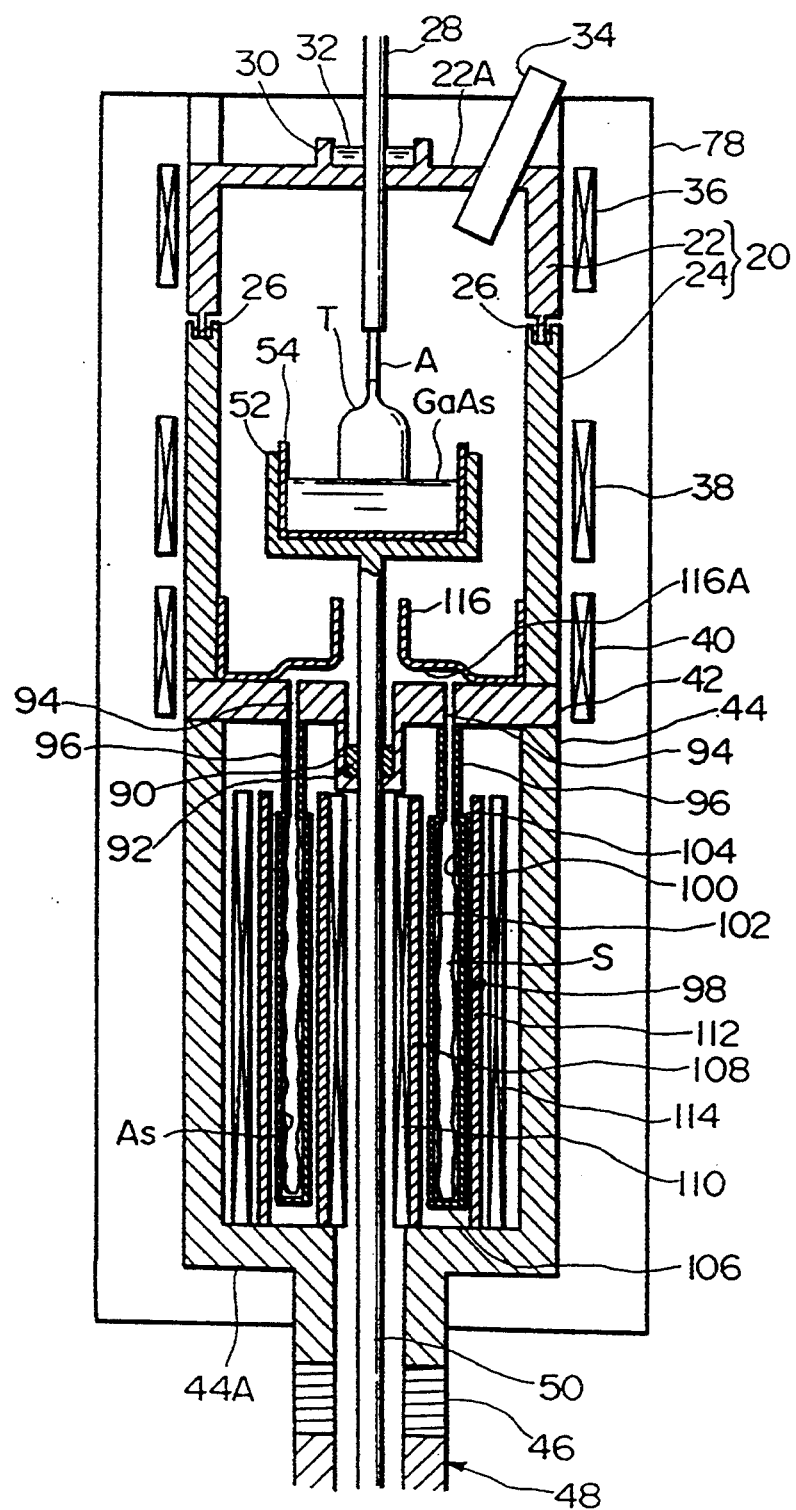
FIG. 8 is a cross sectional view of the apparatus performing single crystal pulling in the second embodiment.

When the synthesizing stage is completed, the temperature of the middle section heater 38 is lowered gradually, and the crystal pulling rod 28 is rotated and lowered to immerse the GaAs single crystal seed A in the GaAs melt and pulled to grow a GaAs single crystal ingot T, as shown in FIG. 8. The details of the growing process are the same as described in the first embodiment.

According to the apparatus of the second embodiment presented above, because the heat pipes 108, 112 and the control heaters (control heater means) 110, 114 are disposed on the inside of the inner wall section 102 and on the outside of the outer wall section 100, it becomes possible to control the temperature from both sides (inside and outside) of the VPCD 98. The uniformity of temperature distribution is further assured by the presence of heat pipes 108, 112 to evenly distribute the heat from the control heaters 110, 114.

In the second embodiment, as in the first embodiment, the VPCD 98 is disposed below the vessel 20, the effects of the temperature variations introduced by the bottom rod 50 is lessened by the presence of the control heater 110 and the heat pipe 108 disposed in the space between the bottom rod 50 and the inner wall section 102. Thereby, the arrangement allows good control of the temperature of the inner wall section 102.

Further, because the VPCD 98 is made cylindrical in shape, the volumetric capacity can be made large by increasing the tube diameter even though the radial dimension of the tube is decreased. The smaller radial dimension of the tube allows the good radial temperature uniformity in the interior space S of the VPCD 98.

Therefore, the overall temperature uniformity of the inner 102 and the outer 100 walls is improved, as well as the fine temperature control thereof, thereby enabling accurate and reliable control over the vapor pressure of the high vapor pressure component. It follows that delicate control over the equilibrium vapor pressure during the compound synthesis stage as well as the crystal growing stage becomes possible so as to reliably produce high quality GaAs single crystals. Further, by facilitating the control over the As temperature and vapor pressure, it becomes possible to simplify the operational procedure.

Comparing the apparatus of the first embodiment shown in FIG. 1 with the second embodiment shown in FIG. 7, it is apparent that the radial distance in the interior space S of the VPCT 68 is larger compared with that of the VPCD 98. The configuration of VPCT 68 is susceptible to the formation of a nonuniform radial temperature distribution in the interior space S. Furthermore, in the apparatus of the first embodiment shown in FIG. 1, heat conduction tends to occur through the bottom rod 50 from the high temperature region in the midsection of the vessel 20 to the VPCT 68, and from the VPCT 68 to the low temperature region of the apparatus, thus further contributing to varying the temperature in the central region of the VPCT 68. Therefore, to conduct precise control of the vapor pressure, the temperature of the bottom section of the VPCT 68 should always be set slightly higher than that of the wall section of the VPCT 68 so that the temperature of the outer wall of the VPCT 68 is the lowest and uniform. The second embodiment effectively solves such a problem.

Experiment based on the Second Embodiment

An apparatus shown in FIG. 5 was constructed. A vapor pressure control device (VPCD) 98 was made of niobium including the bottom plate section 42. The radial distance of the interior space S of the VPCD 98 was 15 mm and the volume thereof was 1.1L, which held 5.8 Kg of densely packed As. The sealing material 26 was made of carbon gasket. The joint between the bottom plate section 42 and the lower vessel section 24 was also sealed using carbon gasket (not shown).

The temperature distribution in the VPCD 98 during the heating stage was measured. The results showed that in the control range of 600°–650° C., the temperature along the entire length of the VPCD 98 was within 0.5° C. of a set temperature, thus confirming the excellent temperature uniformity in the VPCD 98.

A Ga charge of 5 Kg was placed in the crucible 54, and 5.6 Kg of As feed was placed in the feed dish 116. The entire apparatus was evacuated, and the bottom shaft 48 was raised to compress the sealing material 26. Next, the VPCD 98 was heated by turning on the control heaters 110, 114 to 570° C., and the Ga in the crucible 54 was gradually heated by raising the temperature of the upper region of the vessel 20 to between 700°–1,000° C. by turning on the upper and middle heaters 36, 38. The As in the feed dish 116 was radiatively heated, and the As vapor generated reacted with the Ga to synthesize a GaAs melt as the temperature of Ga was increased.

In the meantime, an inert gas was introduced into the furnace housing 78 to balance the pressure between the interior and the exterior atmospheres of the vessel 20. When the GaAs melt temperature in the crucible 54 became sufficiently high, around 1250° C., the temperature of the VPCD 98 was gradually raised to 630° C., at which temperature the GaAs synthesizing reaction was observed to occur continually. When the reaction was stabilized, the temperature of the VPCD 98 was set back to 615° C., and this condition was sustained for five hours.

Next, while leaving the temperature setting for the VPCD 98 at 615° C., the temperature of the middle furnace 38 was gradually lowered, and the crystal pulling rod 28 was rotated and lowered to immerse a GaAs seed single crystal A in the GaAs melt, then it was rotatingly pulled from the GaAs melt to grow a single crystal. The grown ingot T was 110 mm in diameter and 160 mm in length. During the entire crystal growth process, 50 g of As was lost, thus indicating that the operation was carried out without causing serious pressure imbalance between the interior and exterior atmospheres of the vessel 20.

Electrical characterics evaluation of the grown crystal in the seed end and the tail end by the Hall method and the electrical resistivity ranged from $1 \times 10^7$ to $2 \times 10^7$ $\Omega$*cm, and the electron mobility ranged from 6,500 to 7,000 $cm^2/V.s$. These values indicated that the compound synthesis and crystal growth stages of the operation were carried out properly.

A Variation of the Second Embodiment

Figure 9:
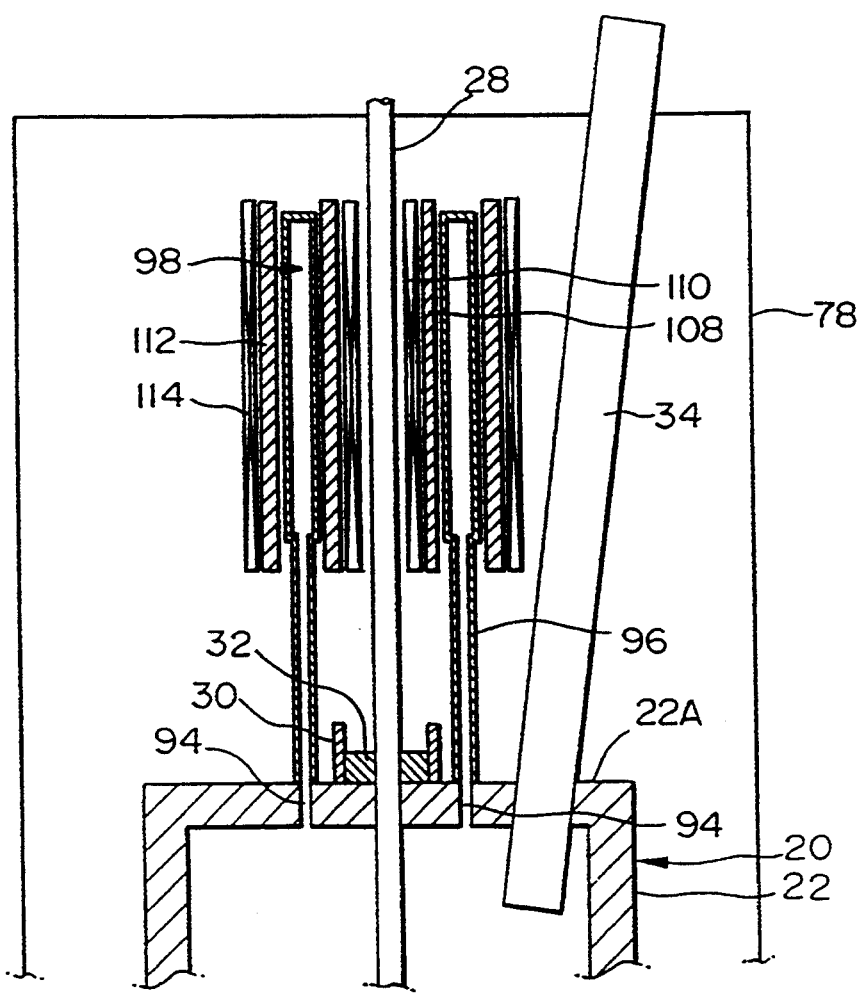
FIG. 9 is a cross sectional view of a variation of an apparatus of the second embodiment for growing a single crystal of a dissociative compound semiconductor.

FIG. 9 presents a cross section of an apparatus according to a variation of the second embodiment of the present invention. Although the VPCD 98 was disposed below the vessel 20 in the second embodiment, it is permissible to place the VPCD 98 above the vessel 20 as shown in FIG. 9. The reference numerals in this figure are the same as those in FIG. 5; the shapes of the various sections and the number of the communication conduits 96 may be varied suitably.

Third Embodiment

Figure 10:
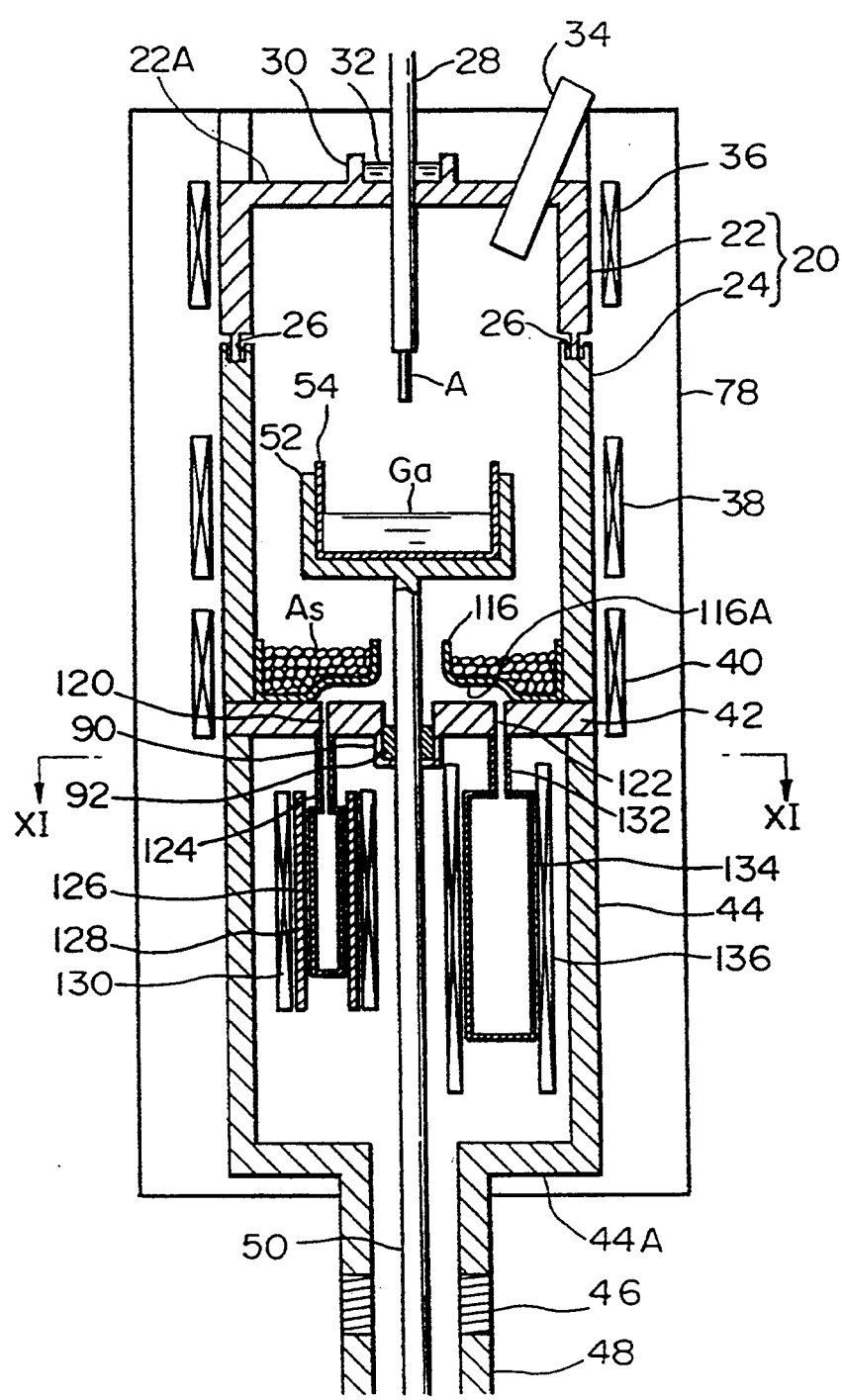
FIG. 10 is a cross sectional view of an apparatus of a third embodiment, showing the condition prior to the stage of compound synthesis, for growing a single crystal of a dissociative compound semiconductor.

FIG. 10 shows a cross section of an apparatus of a third embodiment of the present invention. Those sections of the apparatus common to the first and second embodiments are referred to by the same numerals, and their explanations are omitted. The feature of the third embodiment is the provision of a feed material holding section 134, in addition to a vapor pressure control section (VPCS) 126, and the usual feed dish 60, 116 presented in the previous embodiments.

On the bottom plate section 42 of the lower vessel section 24 are provided with a pair of through holes 120, 122. A communication conduit 124 (communication means) extending downward is fixed to the lower surface of the bottom plate section 42 so as to fit with the through hole 120. The bottom end of the communication conduit 124 is connected to the top end of a cylindrical VPCS 126 extending vertically, and the interior space S of the VPCS 126 is hermetically communicated with the interior space of the vessel 20.

Figure 11:
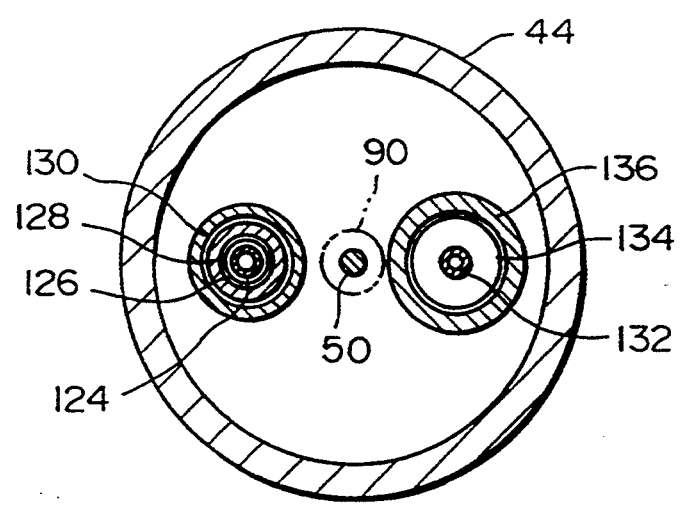
FIG. 11 is a cross sectional view of a section XI—XI shown in FIG. 10.

A cylindrical heat pipe 128 is disposed coaxially with the external periphery of the VPCS 126, as shown in FIG. 11, and the heat pipe 128 is surrounded coaxially with a cylindrical control heater (control heater means) 130, where the heat pipe and the heater are supported by brackets (not shown). The VPCS 126 and the heat pipes 128 are either in contact or separated with a slight spacing.

The heat pipe 128 and the control heater (control heater means) 130 are both longer than the VPCS 126, and their top ends extend beyond the top end of the VPCS 126, and their bottom ends extend beyond the bottom end of the VPCS 126, thereby assuring uniform heating of the hermetic vessel 20.

The internal volumetric capacity of the VPCS 126 is chosen so that it is capable of holding a sufficient amount of condensed As to control the As vapor pressure for the duration of the single crystal growing process of the present invention. In this case, "a sufficient amount" refers to an amount sufficient to compensate for the loss of As expelled out of the vessel 20, and to leave some As condensate in the VPCS 126 after the completion of the growing process. This amount is generally about several hundreds of grams.

On the other hand, at the through hole 122 is a communication conduit 132 fixed to the lower surface of the bottom plate section 42, extending vertically downward therefrom. The bottom end of the communication conduit 132 is fixed to the top end of the feed material storing section 134, and the interior space of the feed storing section 134 is hermetically communicated with that of the VPCS 126.

Surrounding the feed material storing section 134 is a coaxially disposed cylindrical control heater 136, as shown in FIG. 11, and supported by a bracket (not shown). The control heater 136 is longer than the feed material storing section 134, and its terminal ends extend beyond the terminal ends of the feed material storing section 134.

It is most safe to give the feed material storing section 134 an interior volumetric capacity capable of holding the entire amount of As disposed within the vessel 20. However, the volume may be reduced if the process is designed so that the GaAs synthesis proceeds simultaneously with the As sublimation. On the other hand, to rapidly condense any excess As vapor, it is necessary to provide a large surface area on the feed material storing section 134. In view of such considerations, it would be adequate if the volume capacity was more than around 40% of the total As required for the process.

The reason for not providing a heat pipe around the feed material storing section 134 is because it is not necessary that the temperature distribution in the feed material storing section 134 be as uniform as that in the VPCS 126. In other words, during the GaAs synthesis stage, the temperature on the internal wall of the feed material storing section 134 should only be below a specific temperature, on the other hand, after the synthesis, every part of the vessel 20 should only be at a higher temperature than the feed material storing section 134. Other constructions are the same as those in the second embodiment.

Next, the method of using the apparatus of the third embodiment will be explained.

First, a charge of Ga is placed in the crucible 54 as shown in FIG. 10, and an As feed is placed in the feed dish 116. The furnace housing 78 is evacuated, and the bottom shaft 48 is raised to compress the sealing material 26.

Figure 12:
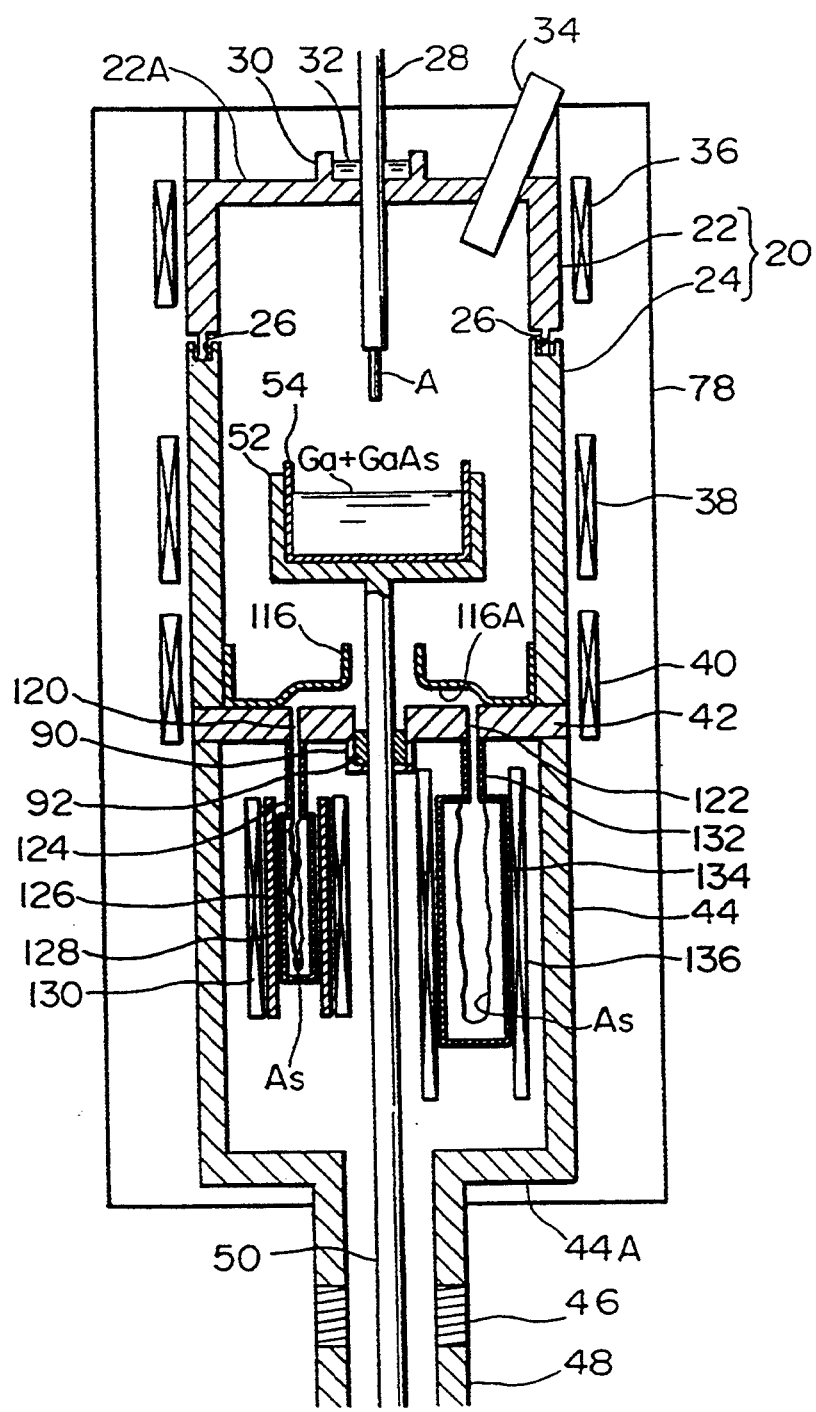
FIG. 12 is a cross sectional view of the apparatus performing compound synthesis in the third embodiment.
Figure 13:
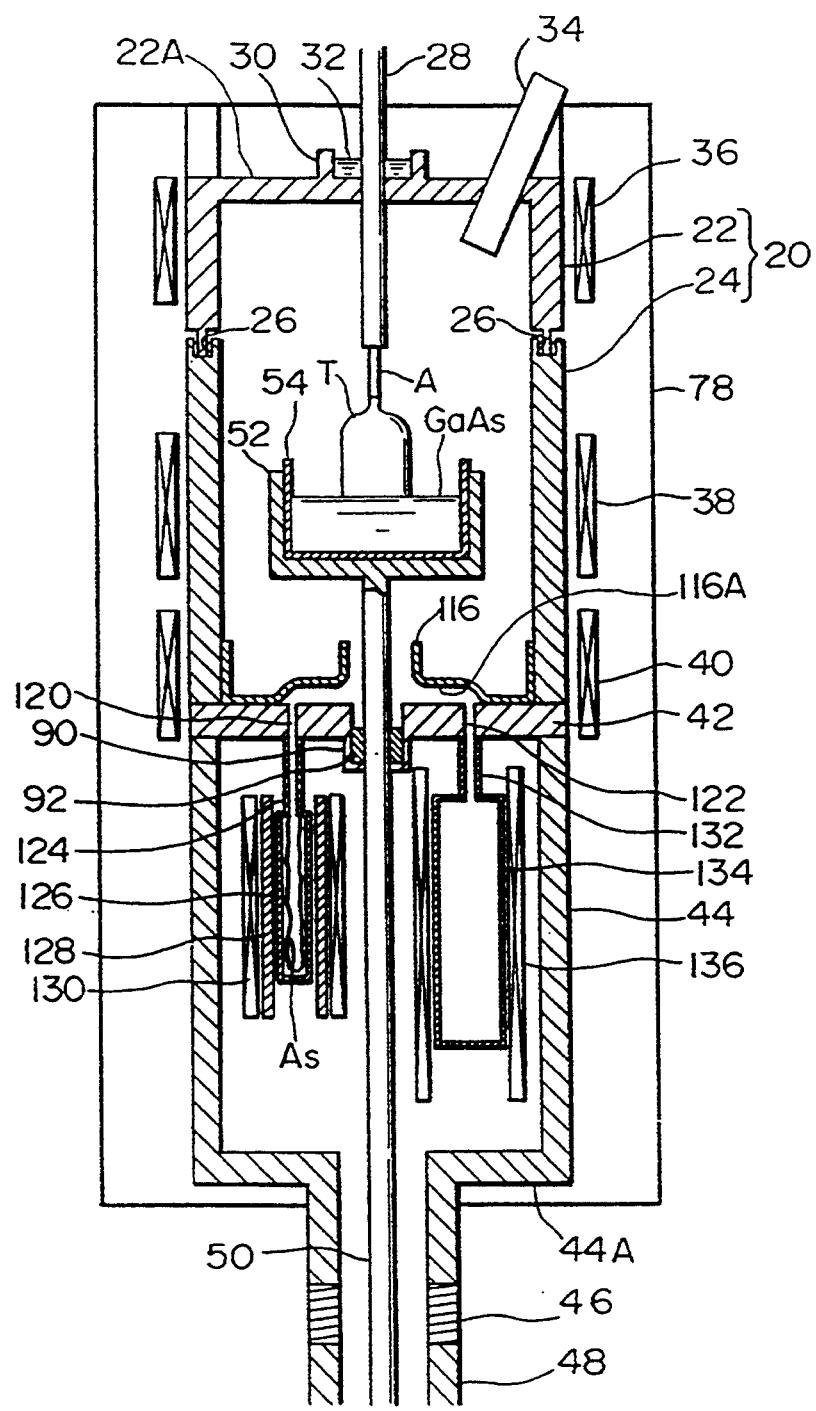
FIG. 13 is a cross sectional view of the apparatus performing single crystal pulling in the third embodiment.

The control heaters (control heater means) 130, 136 are turned on to heat the VPCS 126 and the feed material storing section 134, and at the same time, the upper, middle and bottom section heaters, 36, 38 and 40 are turned on to heat the vessel 20 to a higher temperature than the feed material storing section 134 and the VPCS 126, and the As feed is sublimed. The temperature of the Ga in the crucible 54 is raised further to absorb the As vapor and synthesize GaAs in the crucible 54 while condensing the excess As in the VPCS 126 and in the feed material storing section 134 as shown in FIG. 12.

In the meantime, an inert gas is introduced into the furnace housing 78 to produce a pressure balance between the interior and exterior atmospheres of the vessel 20.

Next, when the temperature of the GaAs melt in the crucible 54 is sufficiently raised, the temperatures of the VPCS 126 and the feed material storing section 134 are raised while setting the temperature of the VPCS 126 slightly lower. Accordingly, the As in the feed material storing section 134 is gradually sublimed, and the GaAs synthesis is continued while leaving sufficient As in the VPCS 126 to control the vapor pressure of As during the synthesis stage.

When the GaAs synthesis stage is completed, the middle heater section 38 is gradually cooled, and the crystal pulling rod 28 is lowered to immerse a GaAs single crystal seed A in the GaAs melt, and a single crystal is rotatingly pulled. The process steps are the same as those in the second embodiment.

According to the apparatus presented above, the GaAs synthesis is performed while holding the feed storing section 134 and the VPCS 126 at relatively lower temperatures than the hermetic vessel 20 so as to first condense all the excess As in the feed storing section 134 and VPCS 126, and then gradually release As from feed storing section 134. By taking this approach the feed material holding section 134 is able to provide a moderating effect against rapid changes in the As vapor pressure which occurs during the synthesis stage. During the crystal growing stage, the As feed in the feed material holding section 134 is used up, and the As vapor pressure is regulated by controlling the temperature of the VPCS 126, the large volume capacity of the feed material storing section 134 does not adversely affect the precision of As vapor pressure control, because As vapor control is performed by the control of the small sized VPCS 126. The volume capacity of the VPCS 126 can be reduced as far as it can hold at once the sufficient amount of As required to regulate the As pressure during the whole crystal growing stage. This design enables to readily achieve good temperature uniformity and control of the VPCS 126, and provides an improved precision of vapor pressure control while also satisfying the large volume requirement for moderating the vapor pressure changes during the GaAs synthesis stage.

Therefore, the apparatus provides high reliability in producing quality GaAs single crystal, because there is neither a danger of As leaking from the vessel 20 caused by a rapid pressure increase during the synthesis stage nor a loss of precision in the vapor pressure control during the crystal growing stage, leading to undesirable off-stoichiometry of the GaAs product. Further, because the vapor pressure control is facilitated, the crystal pulling operation can be simplified.

Further in this embodiment, a heat pipe 128 is disposed between the VPCS 126 and the control heater 130 (control heater means), extending along the VPCS 126, therefore, the temperature uniformity in the VPCS 126 is further improved thereby improving the precision of vapor pressure control. On the other hand, the feed material storing section 134 does not need to be provided with a heat pipe because of the nature of its function, and the diameter of the feed material storing section 134 can be increased accordingly, thereby advantageously increasing its volumetric capacity.

Experiment based on the Third Embodiment

Experiments were carried out using the apparatus shown in FIG. 10, in which the VPCS 126 and the feed material storing section 134 were made of niobium. The VPCS 126 was a cylindrical container of inner diameter 25 mm and the internal volume of 80 mL. This volume can contain a 420 g mass of densely packed As. The temperature distribution in the VPCS 126 was measured, and the results showed that at the temperature setting of 600°–650° C., the temperature deviation was within 0.5° C. at a set temperature over the entire length of the VPCS 126.

The feed material storing section 134 was fabricated as a cylindrical container of an inner diameter 60 mm, having a volume capacity of 800 mL. This volume can contain a 4.2 Kg mass of densely packed As. The sealing material was carbon gasket.

A charge of 5 Kg of Ga was placed in the crucible 54, and 5.6 Kg of As feed was placed in the feed dish 116. The furnace housing 78 was evacuated, and the bottom shaft 48 was raised to close the vessel 20. Next, the VPCS 126 and the feed material storing section 134 were heated to 570° C., and the upper section of the vessel 20 was heated by the top and middle heaters 36, 38 to raise the temperature of the upper section of the vessel 20 to a temperature between 700°–1,000° C. The As in the feed dish 116 was sublimed, and as the Ga temperature rose, GaAs synthesis reaction was observed to occur. An inert gas was introduced into the furnace housing 78 to produce a pressure balance between the interior and exterior atmospheres of the vessel 20.

When the temperature of the GaAs melt in the crucible 54 was raised sufficiently, to around 1250° C., the temperature of the VPCS 126 was raised gradually to 615° C. and that of the feed material storing section 134 gradually to 630° C. to release therein As so as to continue the GaAs synthesis reaction.

When the reaction settled down, the temperature of the VPCS 126 was kept at 615° C., and the temperature of the feed material holding section was raised to 700° C., and this condition was sustained for five hours. Then, while keeping the temperature of the VPCS 126 at 615° C., the middle section heater 38 (heater means) was gradually cooled, and the crystal pulling rod 28 was lowered to immerse a GaAs single crystal seed A into the GaAs melt, and the rod 28 was rotatingly pulled up to produce a single crystal. The grown ingot T was 110 mm in diameter and 150 mm in length.

Electrical characteristics evaluation by Hall measurement of the grown crystal in the seed end and the tail end showed the electrical resistivity ranged from $1.5 \times 10^7$ Ω*cm to $2.5 \times 10^7$ Ω*cm, and the electron mobility ranged from 6,600 to 6,900 cm²/V.s. These values indicated that in the compound synthesis and crystal growth stages of the operation, the control of stoichiometry was carried out properly.

The loss of As during the entire growing process was 55 g. Of the total As, the excess As is 230 g, of which about 80 g is used to produce the As atmosphere in the vessel 20. Therefore, calculating from the lost amount, it indicates that about 95 g was condensed in the VPCS 126 during the growth stage. This result indicates that the vapor pressure control was carried out properly during the growth process that the pressure balance was not significantly disturbed.

A variation of the Third Embodiment

Figure 14:
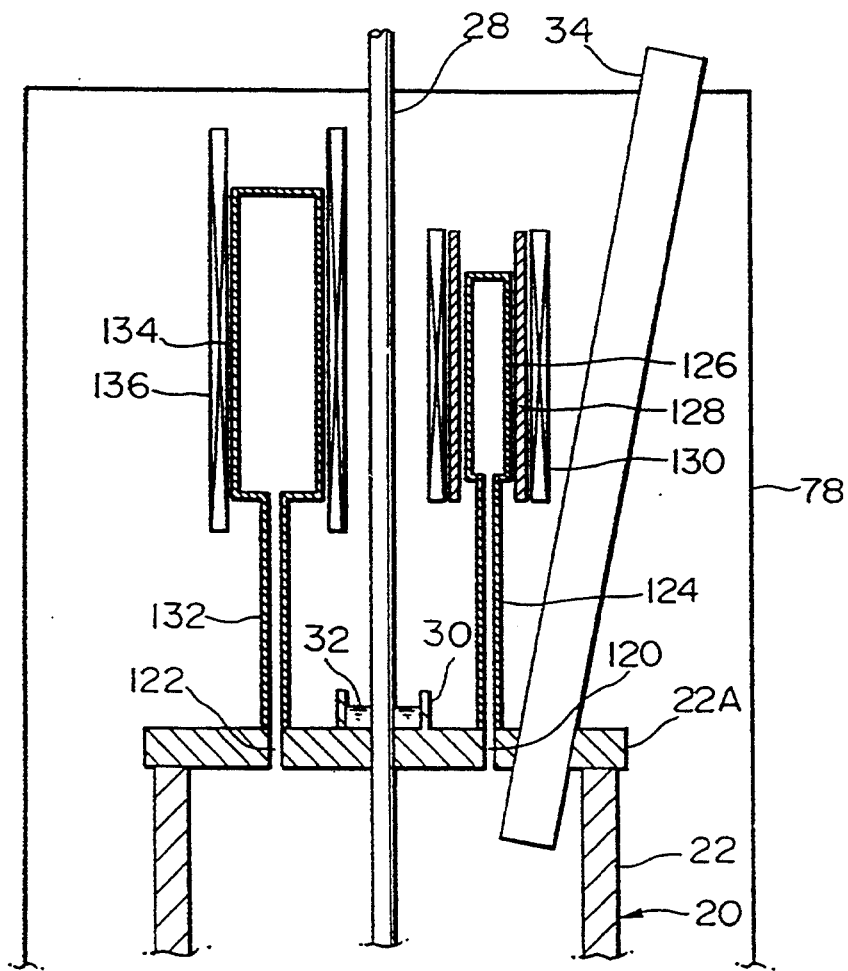
FIG. 14 is a cross sectional view of a variation of the apparatus of the third embodiment for growing a single crystal of a dissociative compound semiconductor.
Figure 15:
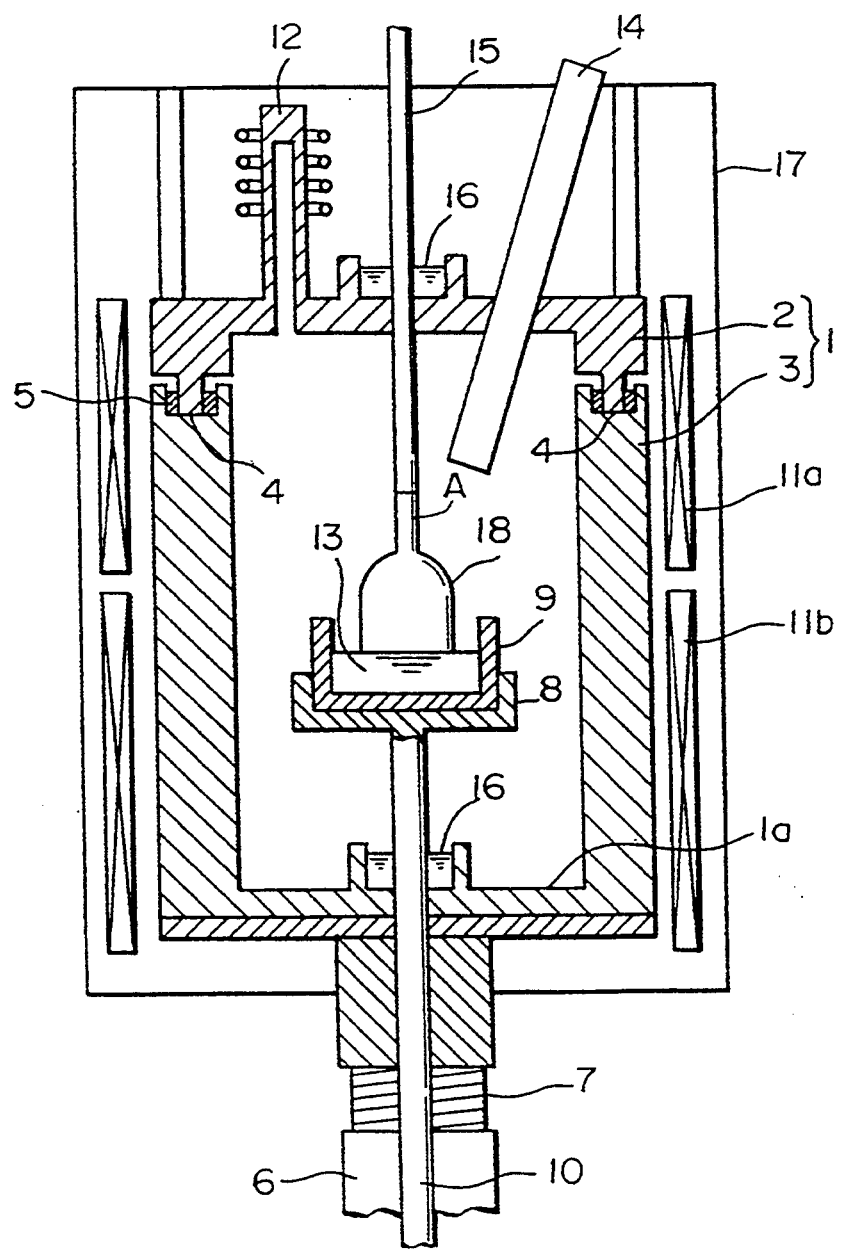
FIG. 15 is a cross sectional view of a conventional apparatus for growing single crystal of a dissociative compound semiconductor.

FIG. 14 shows an apparatus according to a variation of the third embodiment of the present invention. In the third embodiment, the VPCS 126 and the feed material storing section 134 were disposed below the vessel 20. However, the present invention is not restricted to such a configuration, and it is possible to dispose them both above the vessel 20 as shown in FIG. 14. The reference numerals are the same as those in the third embodiment.

The basic design further allows disposing the VPCS 126 below (or above) the vessel 20; the feed material storing section 134 above (or below) the vessel 20; as well as separating a feed material storing sections 134 and disposing them both above and below the vessel 20.

Further, various combinations of the components presented in the embodiments may be made. For example, a VPCS 126 shown in FIG. 14 may be provided above (or below) the vessel 20 in combination with the VPCT 68 shown in FIG. 1 or 4, or with VPCD 98 (acting as the feed material holding means) shown in FIGS. 5 or 9 disposed below (or above) the vessel 20. Further, if the VPCD 98 is used as a feed material holding means, heat pipes 108, 112 are not necessary.

Furthermore, the structural configurations in the above embodiments are also applicable to other high vapor pressure growth systems such as the vertical Bridgeman crystal growth apparatus, as well as for synthesis apparatus and processing apparatus for compounds exhibiting high decomposition pressures or vapor pressures.

What is claimed is:

1. An apparatus for growing a single crystal of a compound semiconductor material comprising a high vapor pressure component and a low vapor pressure component, said apparatus comprising:
   (a) an openable hermetic vessel of a cylindrical shape having a ceiling plate section for closing the vessel top, and a bottom plate section for closing the vessel bottom;
   (b) a bottom rod inserted hermetically and rotatably through said bottom plate section into said vessel;
   (c) a crucible fixedly disposed on the top end of said bottom rod extending inside said vessel for holding said low vapor pressure component material;
   (d) a crystal pulling rod inserted hermetically and rotatably through said ceiling plate section into said vessel; and
   (e) a feed material dish disposed inside said vessel for holding said high vapor pressure component material;
   (f) a vapor pressure control tube disposed hermetically below said vessel so as to coaxially surround said bottom rod;
   (g) communication conduit means for hermetically communicating said vapor pressure control tube with said vessel for transport of vapor molecules of said high vapor pressure component material into and out of said vessel; and
   (h) heater means provided around at least the external peripheries of:
   said vapor pressure control tube;
   an upper section of said vessel so as to encircle said crucible disposed inside said vessel; and
   a region of said vessel so as to encircle said feed material dish disposed inside said vessel; wherein a single crystal ingot is grown from a compound semiconductor melt synthesized in said crucible by the reaction between said high vapor pressure component material with said low vapor pressure component material, and the vapor pressure of said high vapor pressure component material contained in said vessel is controlled by said vapor pressure cotnrol tube during both the compound synthesis stage and the ingot production stage.

2. An apparatus as claimed in claim 1, wherein a support tube provided with a bearing section is disposed surrounding said bottom rod, and a liquid sealant is disposed so as to seal the space between said bottom rod 3. An apparatus for growing a single crystal of a compound semiconductor material comprising a high vapor pressure component and a low vapor pressure component, said apparatus comprising:
   (a) an openable hermetic vessel of a cylindrical shape having a ceiling plate section for closing the vessel top, and a bottom plate section for closing the vessel bottom;
   (b) a bottom rod inserted hermetically and rotatably through said bottom plate section into said vessel;
   (c) a crucible fixedly disposed on the top end of said bottom rod extending inside said vessel for holding said low vapor pressure component material;
   (d) a crystal pulling rod inserted hermetically and rotatably through said ceiling plate section into said vessel; and
   (e) a feed material dish disposed inside said vessel for holding said high vapor pressure component material;
   (f) a vapor pressure control tube disposed hermetically on an external surface of said ceiling plate section of said vessel so as to coaxially surround said crystal pulling rod;
   (g) communication conduit means for hermetically communicating said vapor pressure control tube with said vessel for transport of vapor molecules of said high vapor pressure component material into and out of said vessel; and
   (h) heater means provided around at least the external peripheries of:
   said vapor pressure control tube;
   an upper section of said vessel so as to encircle said crucible disposed inside said vessel; and
   a region of said vessel so as to encircle said feed material dish disposed inside said vessel; wherein a single crystal ingot is grown from a compound semiconductor melt synthesized in said crucible by the reaction between said high vapor pressure component material with said low vapor pressure component material, and the vapor pressure of said high vapor pressure component material contained in said vessel is controlled by said vapor pressure control tube during both the compound synthesis stage and the ingot production stage. and said support tube.

4. An apparatus as claimed in claim 3, wherein a support tube provided with a bearing section is disposed surrounding said crystal pulling rod, and a liquid sealant is disposed so as to seal the space between said crystal pulling rod and said support tube.

5. An apparatus as claimed in one of claims 1, 2, 3, or 4, wherein a volumetric capacity of the interior space of said vapor pressure control tube is sufficient for holding, in a densely condensed form, not less than 40% of a total amount of said high vapor pressure component material required for compound synthesis and crystal growth.

6. An apparatus for processing a compound semiconductor material comprising a high vapor pressure component and a low vapor pressure component, said apparatus comprising:
   (a) an openable hermetic vessel of a cylindrical shape having a ceiling plate section for closing the vessel top, and a bottom plate section for closing the vessel bottom;
   (b) heating means for heating said vessel;
   (c) a vapor pressure control device whose interior space is hermetically communicated with an interior space of said vessel;
wherein said vapor pressure control device comprises:
   (d) a cylindrical pressure container having a hermetic interior space defined by an outer wall section, a coaxial inner wall section, a ceiling section and a bottom section;
   (e) communication conduit means hermetically communicating said interior space of said cylindrical pressure container with said interior space of said vessel;
   (f) a heat pipe means disposed around at least one selected from the group consisting of the inside surface of said inner wall section and the outside surface of said outer wall section;
   (g) a control heater means disposed along the inside surface of said inner wall section, and a control heater means disposed along the outside surface of said outer wall section; wherein said compound semiconductor material disposed inside said vessel is processed by controlling the vapor pressure of said high vapor pressure component material.

7. An apparatus for processing a compound semiconductor material comprising a high vapor pressure component and a low vapor pressure component, said apparatus comprising:
   (a) an openable hermetic vessel of a cylindrical shape having a ceiling plate section for closing the vessel top, and a bottom plate section for closing the vessel bottom;
   (b) heating means for heating said vessel;
   (c) a vapor pressure control device whose interior space is hermetically communicated with an interior space of said vessel; wherein said vapor pressure control device comprises:
   (d) a cylindrical pressure container having a hermetic interior space defined by an outer wall section, a coaxial inner wall section, a ceiling section and a bottom section, and disposed on an external surface of said ceiling plate of said vessel;
   (e) communication conduit means hermetically communicating said interior space of said cylindrical pressure container with said interior space of said vessel;
   (f) a heat pipe means disposed around at least one selected from the group consisting of the inside surface of said inner wall section and the outside surface of said outer wall section;
   (g) a control heater meaNs disposed along the inside surface of said inner wall section, and a control heater means disposed along the outside surface of said outer wall section;
wherein said compound semiconductor material disposed inside said vessel is processed by controlling the vapor pressure of said high vapor pressure component material.

8. An apparatus as claimed in one of claims 6 and 7, wherein said apparatus is further provided with:
   (a) a bottom rod inserted hermetically and rotatably through said bottom plate section into said vessel;
   (b) a crucible fixedly disposed on the top end of said bottom rod extending inside said vessel for holding said low vapor pressure component material; and
   (c) a crystal pulling rod inserted hermetically and rotatably through said ceiling plate section into said vessel for pulling a single crystal ingot from a compound melt synthesized by the reaction between said low pressure component material contained in said crucible with said high vapor pressure component material while controlling the vapor pressure of said high vapor pressure component material.

9. An apparatus as claimed in one of claims 6 or 7, wherein a volumetric capacity of said interior space of said vapor pressure control device is sufficient for holding, in a densely condensed form, not less than 40% of a total amount of said high vapor pressure component material required for processing.

10. An apparatus for processing a compound semiconductor material comprising a high vapor pressure component material and a low vapor pressure component material, said apparatus comprising:
   (a) an openable hermetic vessel of a cylindrical shape having a ceiling plate section for closing the vessel top, and a bottom plate section for closing the vessel bottom;
   (b) heating means for heating said vessel;
   (c) a vapor pressure control section whose interior space is hermetically communicated with an interior space of said vessel;
   (d) control heater means for controlling the temperature of said vapor pressure control section;
   (e) a hermetic feed material storing section disposed on an externel surface of said ceiling plate section or an external surface of said bottom plate section of said vessel;
   (f) communication means communicating said space of said hermetic feed material storing section with said interior space of said vessel;
   (g) control heater means for heating said feed material storing section;
wherein a part of said high vapor pressure component material is condensed in said vapor pressure control section thereby controlling the vapor pressure of said high vapor pressure component material contained in said vessel.

11. An apparatus as claimed in claim 10, further provided with heat pipe means extending along said vapor pressure control section.

12. An apparatus as claimed in one of claims 10 and 11, wherein said apparatus is further provided with:
   (a) a bottom rod inserted hermetically and rotatably through said bottom plate section into said vessel;
   (b) a crucible fixedly disposed on the top end of said bottom rod extending inside said vessel for holding said low vapor pressure component material; and
   (c) a crystal pulling rod inserted hermetically and rotatably through said ceiling plate section into said vessel for pulling a single crystal ingot from a compound melt synthesized by reacting said low pressure component material contained in said crucible with said high vapor pressure component material by controlling the vapor pressure of said high vapor pressure component material.

13. An apparatus as claimed in one of claims 10 or 11, wherein a volumetric capacity of said interior space of said vapor pressure control section is sufficient for holding, in a densely condensed form, not less than 40% of a total amount of said high vapor pressure component material required for processing.

14. A method for growing a single crystal of a compound semiconductor material comprising a high vapor pressure component material and a low vapor pressure component material in an apparatus provided with:
- an openable hermetic vessel provided with a feed material holder for holding said high vapor pressure component material in an interior space of said vessel;
- a crucible disposed in an interior space of said vessel for holding said low vapor pressure component material;
- vapor pressure control section hermetically communicating said vapor pressure control section with said vessel for transport of the vapor molecules of said high vapor pressure component material into and out of said vessel;

said method comprising the steps of:
- (a) disposing a charge of said high vapor pressure component material in said feed material holder;
- (b) disposing a charge of said low vapor pressure component material in said crucible;
- (c) raising the temperature of all the regions of said vessel, excluding said charge of said high vapor pressure component material and said vapor pressure control device, to a specific temperature thereby raising the temperature of said feed material holder to sublime said high vapor pressure component material;
- (d) transferring and condensing and high vapor pressure component material in said vapor pressure control section;
- (e) heating said charge of said low vapor pressure component material in said crucible to a temperature higher than the melting point of said compound semiconductor material simultaneously with step (d) or after the completion of step (d);
- (f) heating the high vapor pressure component material condensed in said vapor pressure control section to a specific temperature to produce a vapor of said high vapor pressure component material;
- (g) making said vapor of high vapor pressure component material react with said charge of low vapor pressure component material and synthesizing a melt of said compound semiconductor material;
- (h) pulling a single crystal ingot from the melt of said compound semiconductor material to produce said single crystal ingot while controlling the temperature of said vapor pressure control section to keep the pressure of said high vapor pressure component inside said vessel constant.

15. A method for growing a single crystal of a compound semiconductor material comprising a high vapor pressure component material and a low vapor pressure component material in an apparatus provided with:
- an openable hermetic vessel provided with a feed material holder for holding said high vapor pressure component material in an interior space of said vessel;
- a crucible disposed in an interior space of said vessel for holding said low vapor pressure component material;
- vapor pressure control section hermetically communicating with said vessel, for transport of the vapor molecules of said high vapor pressure component material into and out of said vessel; and
- said feed material storing section hermetically communicating with said vessel for transport of the vapor molecules of said high vapor pressure component material into and out of said vessel;

said method comprising the steps of:
- (a) disposing a charge of said high vapor pressure component material in said feed material holder;
- (b) disposing a charge of said low vapor pressure component material in said crucible;
- (c) raising the temperature of all the regions of said vessel, excluding said feed material holder and said feed material storing section as well as said vapor pressure control section, to a specific temperature, thereby raising the temperature of said feed material holder to sublime said high vapor pressure component material;
- (d) transferring and condensing said high vapor pressure component material in said feed material storing section as well as in said vapor pressure control section;
- (e) heating said charge of said low vapor pressure component material in said crucible to a temperature higher than the melting point of said compound semiconductor material simultaneously with step (d) or after the completion of step (d):
- (f) heating the high vapor pressure component material condensed in said feed material storing section to a specific temperature to produce a vapor of said high vapor pressure component material;
- (g) making said vapor of high pressure component material react with said charge of said low vapor pressure component material to synthesize a melt of said compound semiconductor material;
- (h) raising the temperature of feed material storing section until said high vapor pressure component material stored therein is completely removed;
- (i) keeping the vapor pressure of said high vapor pressure component material constant by controlling the temperature of said vapor pressure control section;
- (j) pulling a single crystal ingot from the melt of said compound semiconductor material to produce said single crystal ingot while controlling the temperature of said vapor pressure control section to keep the pressure of said high vapor pressure component inside said vessel constant.

16. A method as claimed in one of claims 14 and 15, wherein said compound semiconductor material having high vapor pressure is GaAs, and said high vapor pressure component is As, and said low pressure component is Ga.

* * * * *

UNITED STATES PATENT AND TRADEMARK OFFICE
CERTIFICATE OF CORRECTION

PATENT NO. : 5,373,808
DATED : December 20, 1994
INVENTOR(S) : Koichi SASSA, et al.

It is certified that error appears in the above-indentified patent and that said Letters Patent is hereby corrected as shown below:

On the title page, Item [87], the PCT Publishing Number and the PCT Publishing Date are listed incorrectly. They should read:

--[87] PCT Pub. No.:     WO93/06264
       PCT Pub. Date:    Apr. 1, 1993--

Signed and Sealed this

Fourth Day of April, 1995

Attest:

BRUCE LEHMAN

Attesting Officer        Commissioner of Patents and Trademarks